(12) United States Patent
Wu et al.

(10) Patent No.: US 9,761,480 B1
(45) Date of Patent: Sep. 12, 2017

(54) METHODS OF FORMING FIELD EFFECT TRANSISTOR (FET) AND NON-FET CIRCUIT ELEMENTS ON A SEMICONDUCTOR-ON-INSULATOR SUBSTRATE

(71) Applicant: GLOBALFOUNDRIES Inc., Grand Cayman (KY)

(72) Inventors: Xusheng Wu, Ballston Lake, NY (US); Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 2 days.

(21) Appl. No.: 15/047,137

(22) Filed: Feb. 18, 2016

(51) Int. Cl.
| | |
|---|---|
| H01L 21/762 | (2006.01) |
| H01L 21/84 | (2006.01) |
| H01L 21/308 | (2006.01) |
| H01L 21/3213 | (2006.01) |
| H01L 21/311 | (2006.01) |
| H01L 29/08 | (2006.01) |
| H01L 29/06 | (2006.01) |
| H01L 27/12 | (2006.01) |

(52) U.S. Cl.
CPC ...... H01L 21/76283 (2013.01); H01L 21/308 (2013.01); H01L 21/31111 (2013.01); H01L 21/32139 (2013.01); H01L 21/84 (2013.01); H01L 27/1203 (2013.01); H01L 29/0649 (2013.01); H01L 29/0847 (2013.01)

(58) Field of Classification Search
CPC . H01L 21/76283; H01L 21/84; H01L 21/308; H01L 27/1203; H01L 21/31111; H01L 29/0847; H01L 29/0649; H01L 21/32139

USPC ......................................................... 257/347
See application file for complete search history.

(56) References Cited

U.S. PATENT DOCUMENTS

| | | | |
|---|---|---|---|
| 2013/0146953 A1* | 6/2013 | Cheng | H01L 21/84 257/296 |
| 2015/0093861 A1* | 4/2015 | Loubet | H01L 21/84 438/154 |
| 2015/0287642 A1* | 10/2015 | Chang | H01L 21/8249 438/236 |

* cited by examiner

Primary Examiner — Fernando L Toledo
Assistant Examiner — Adam S Bowen
(74) Attorney, Agent, or Firm — Amerson Law Firm, PLLC

(57) ABSTRACT

One illustrative method disclosed includes forming an isolation structure so as to define first and second active regions on the SOI substrate, forming a field effect transistor above the first active region and forming an opening in the second active region that exposes an upper surface of the bulk semiconductor layer in the second active region. In this example, the method further includes performing a common epitaxial growth process so as to form an epi semiconductor material region above each of the source/drain regions of the transistor and to form a unitary epi semiconductor structure above the second active region, wherein the unitary epi semiconductor structure is formed on and in contact with the exposed upper surface of the bulk semiconductor layer within the opening and on and in contact with an upper surface of the active layer in the second active region.

26 Claims, 23 Drawing Sheets

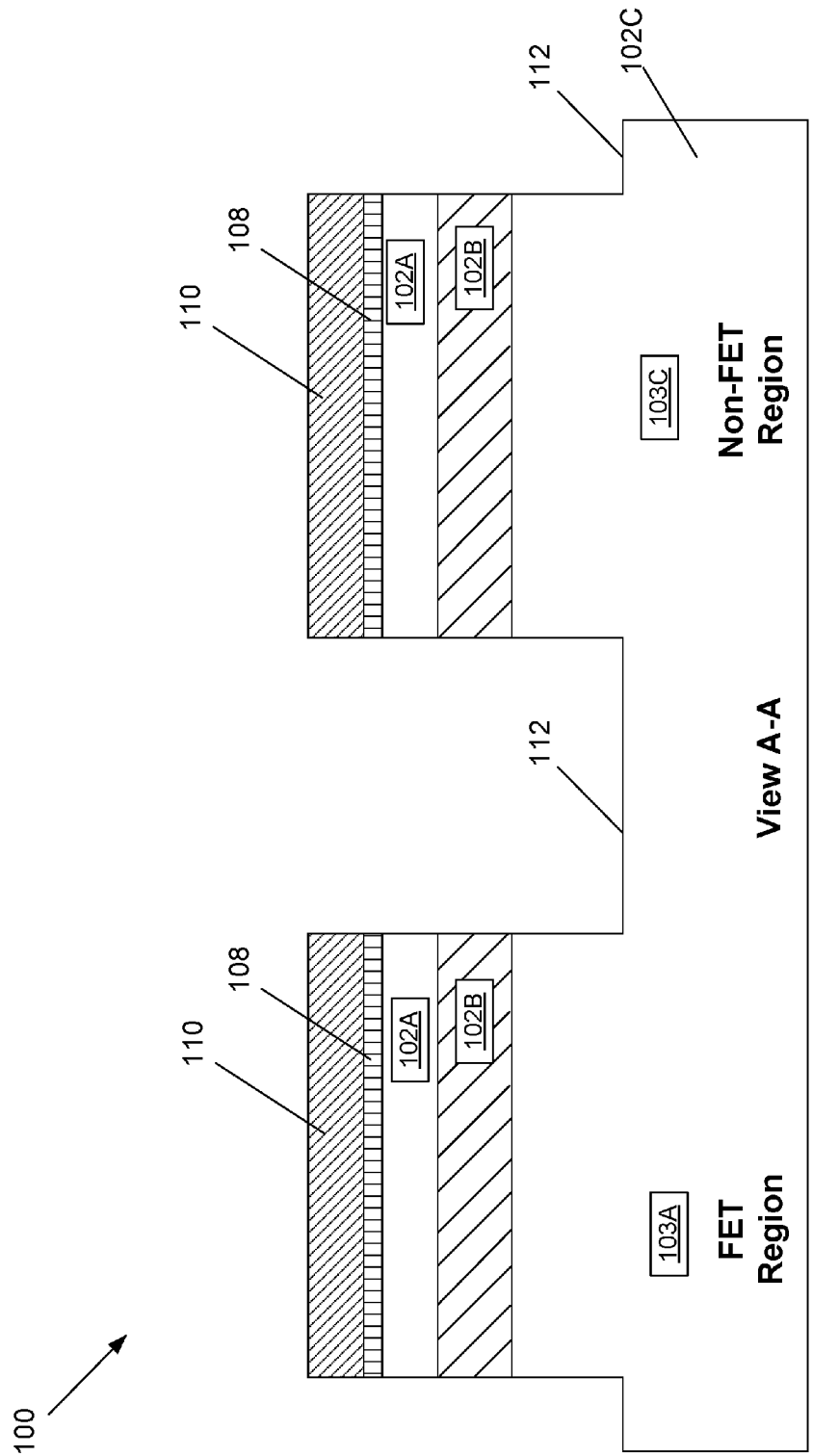

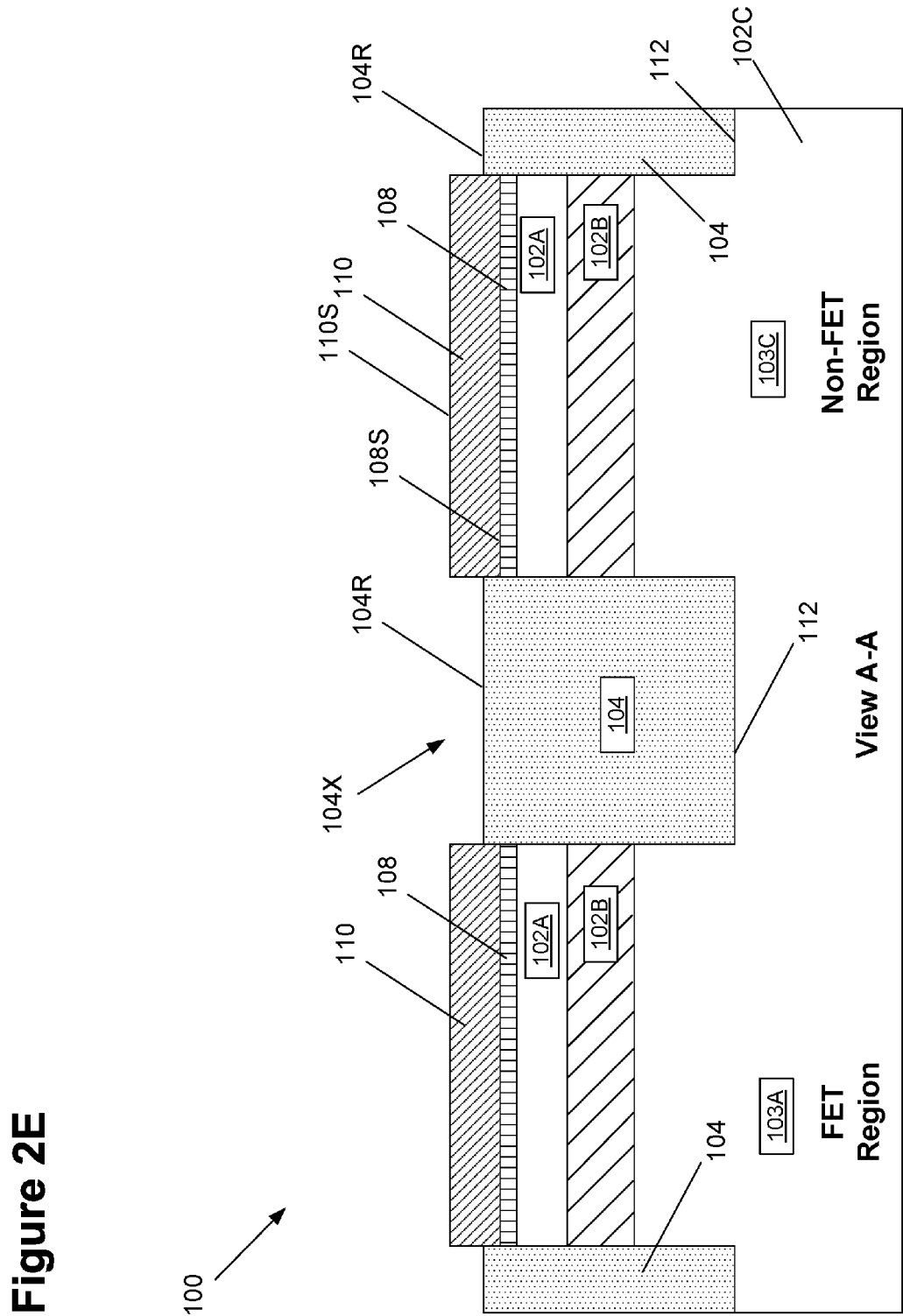

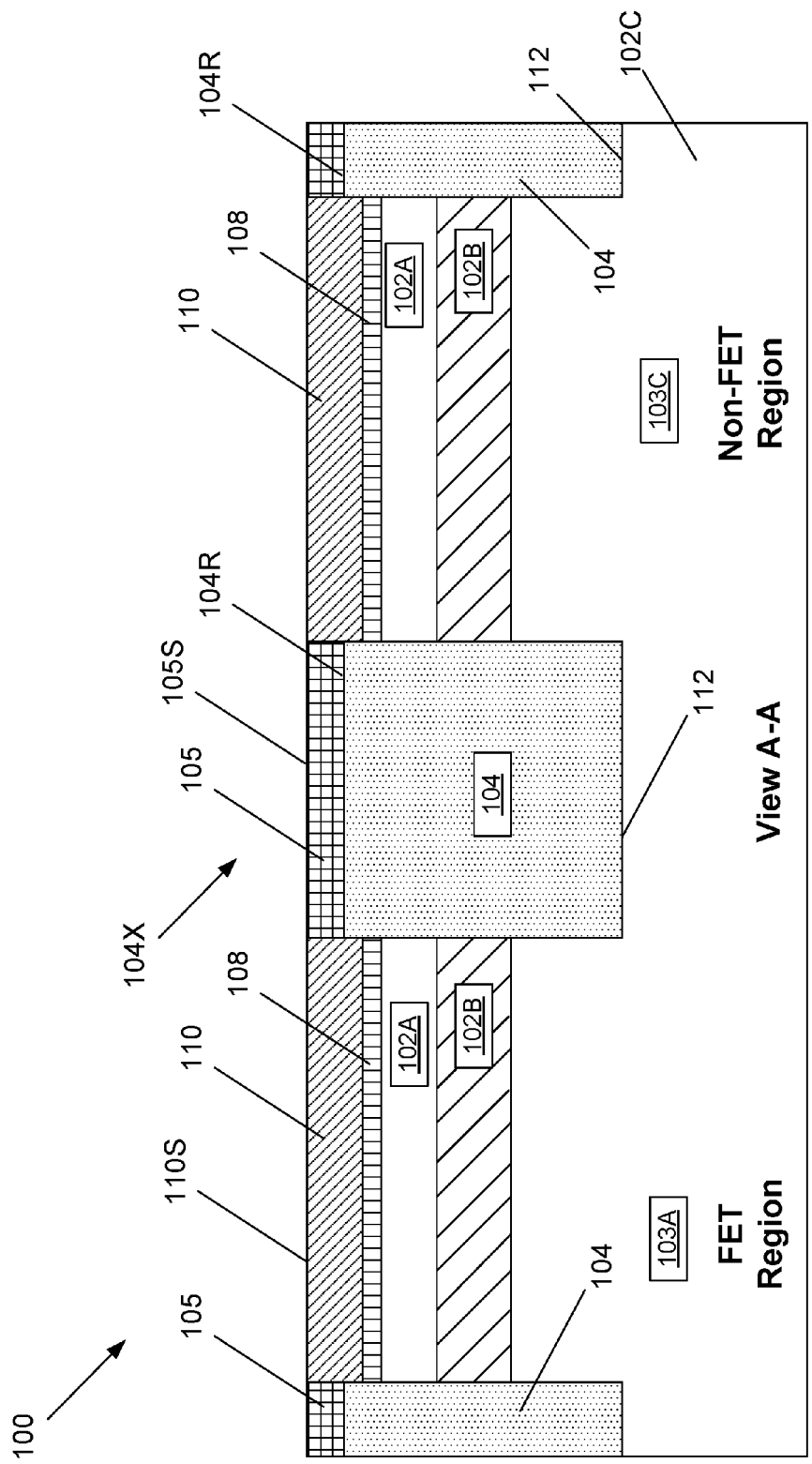

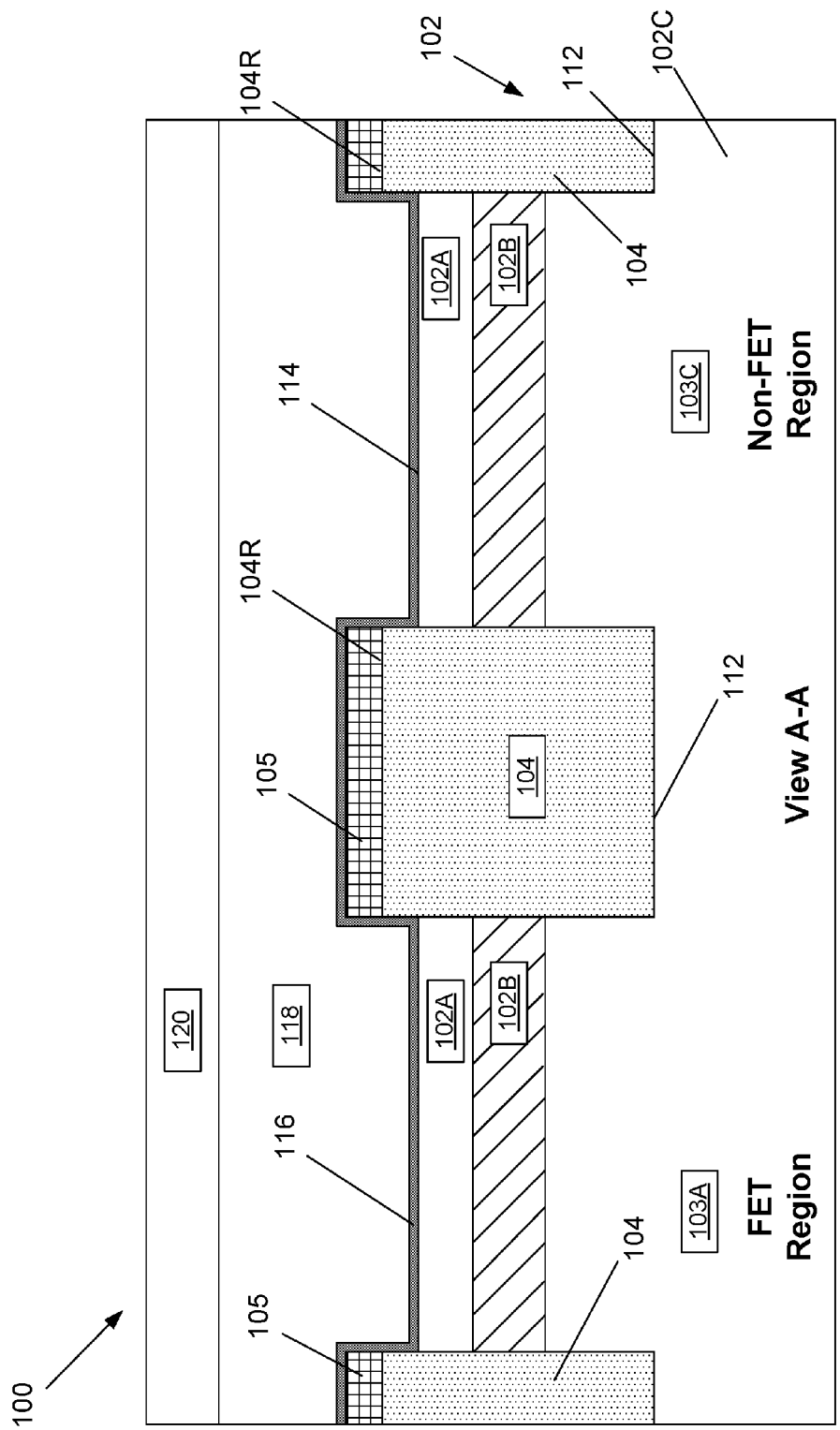

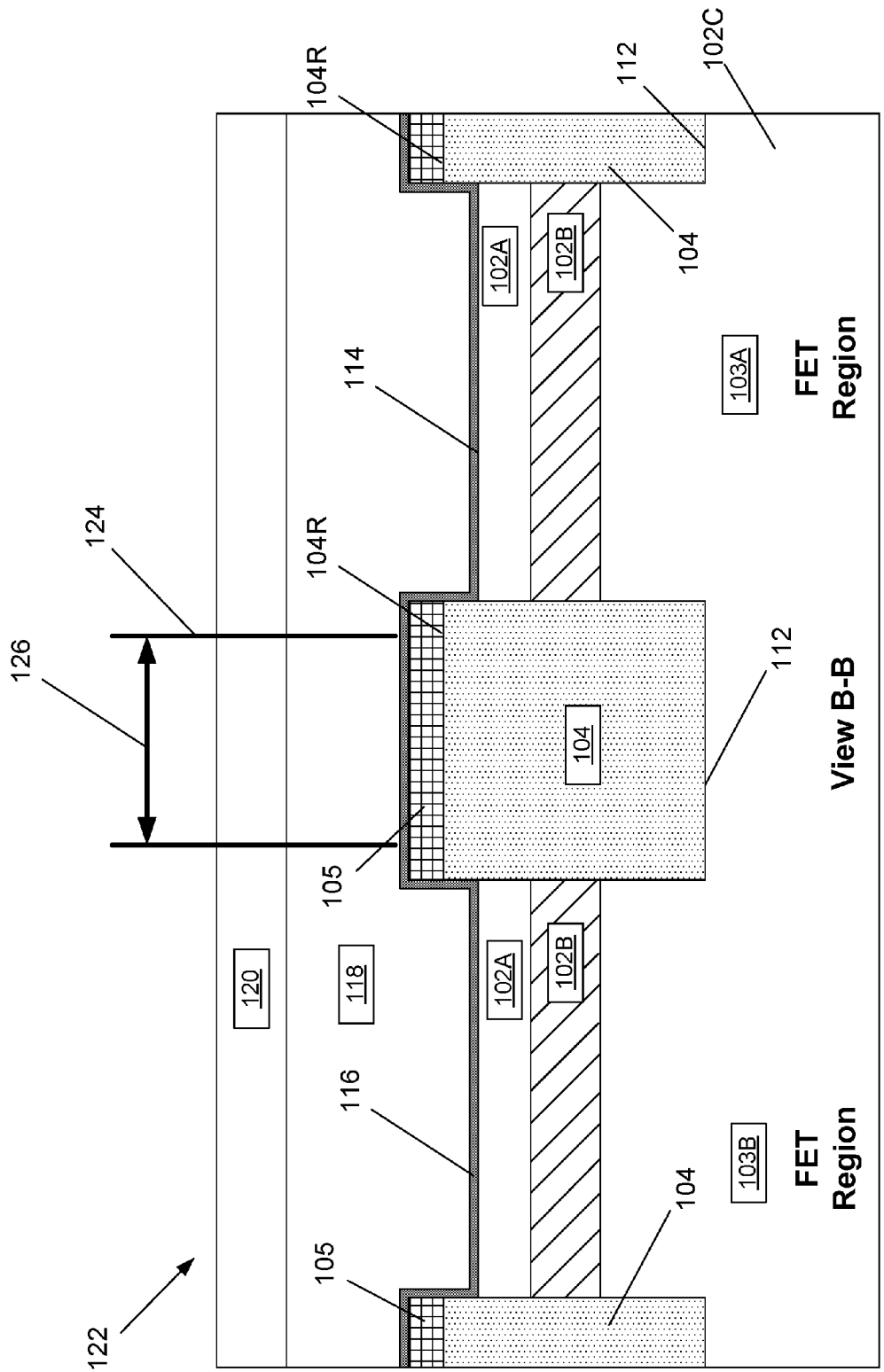

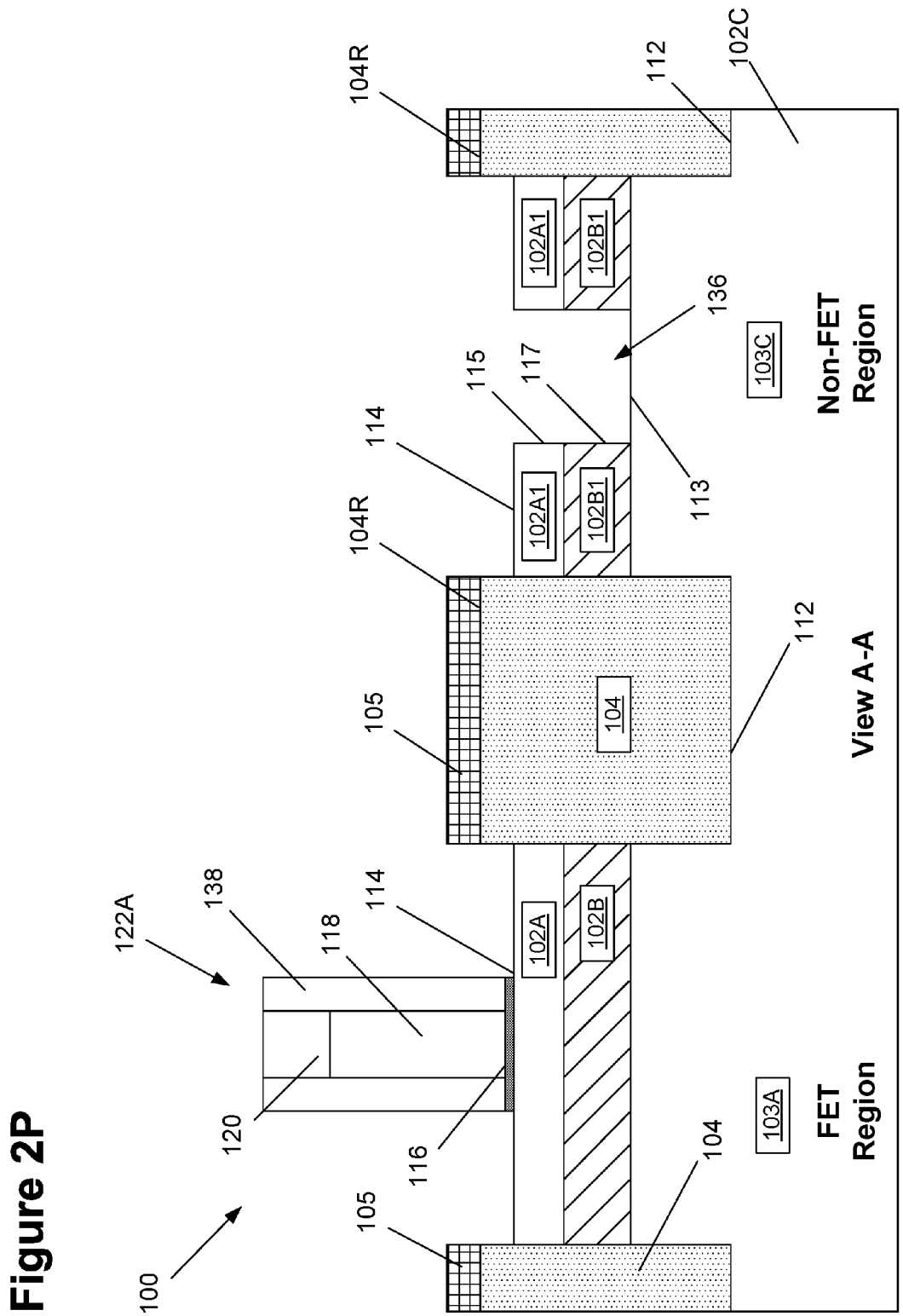

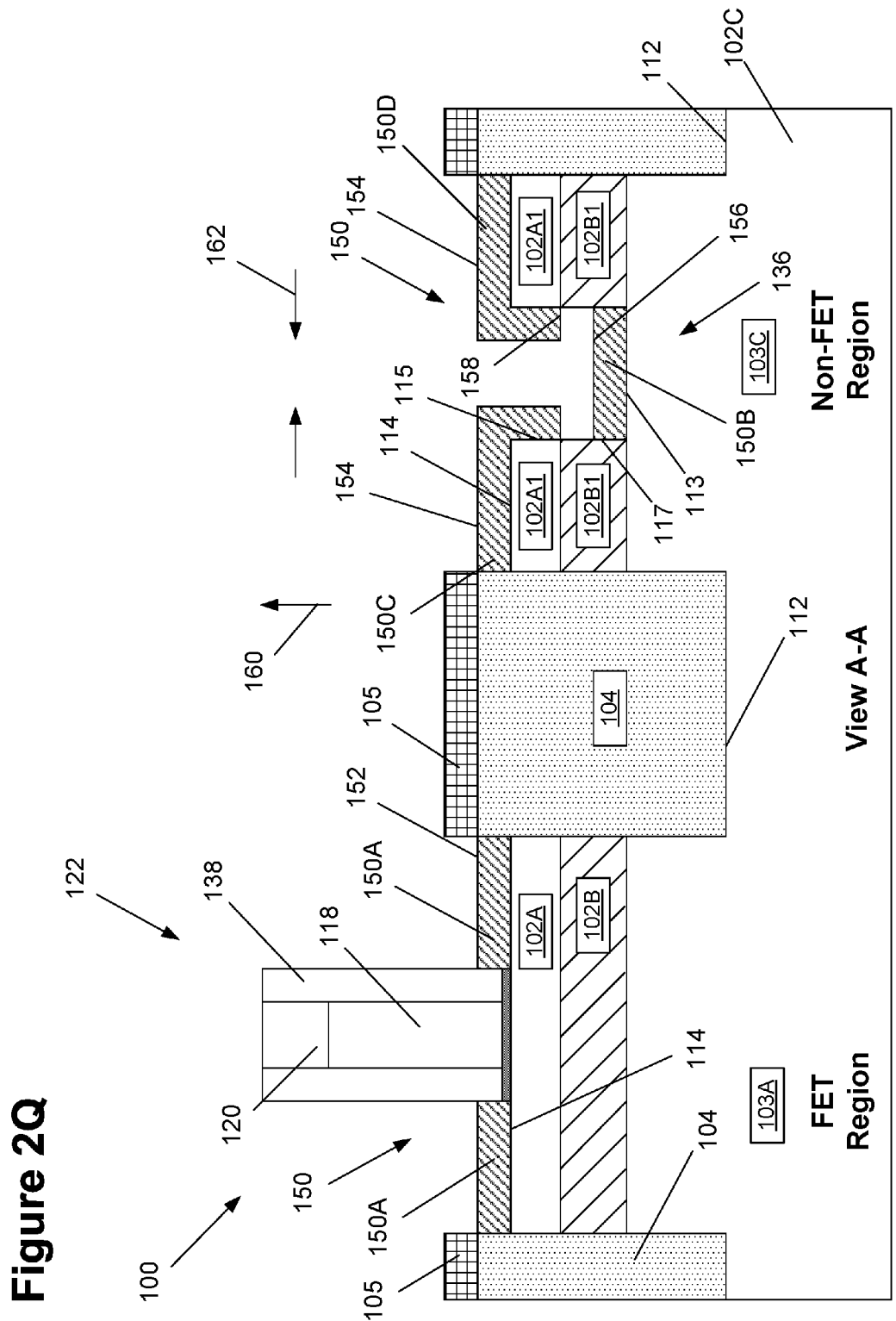

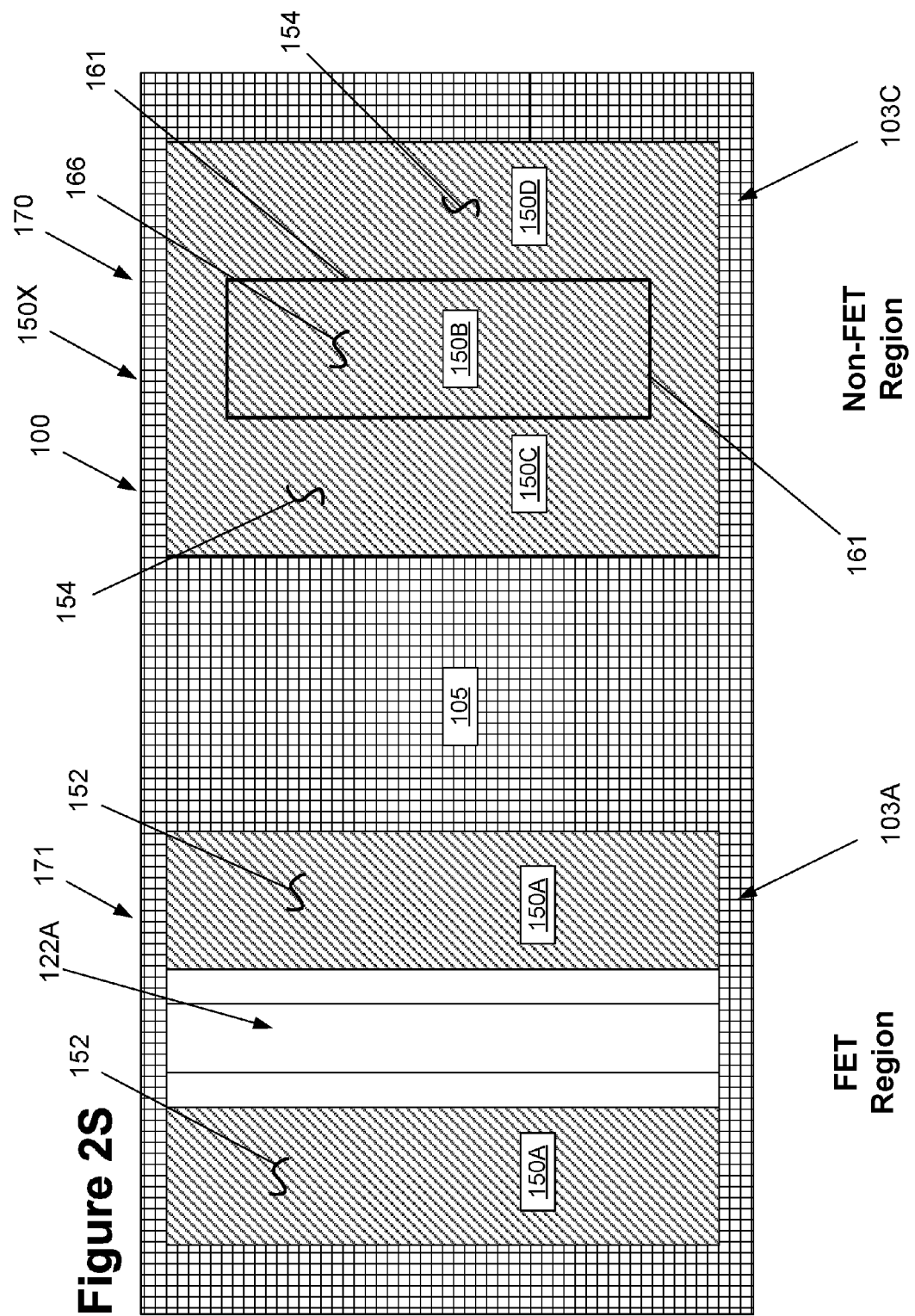

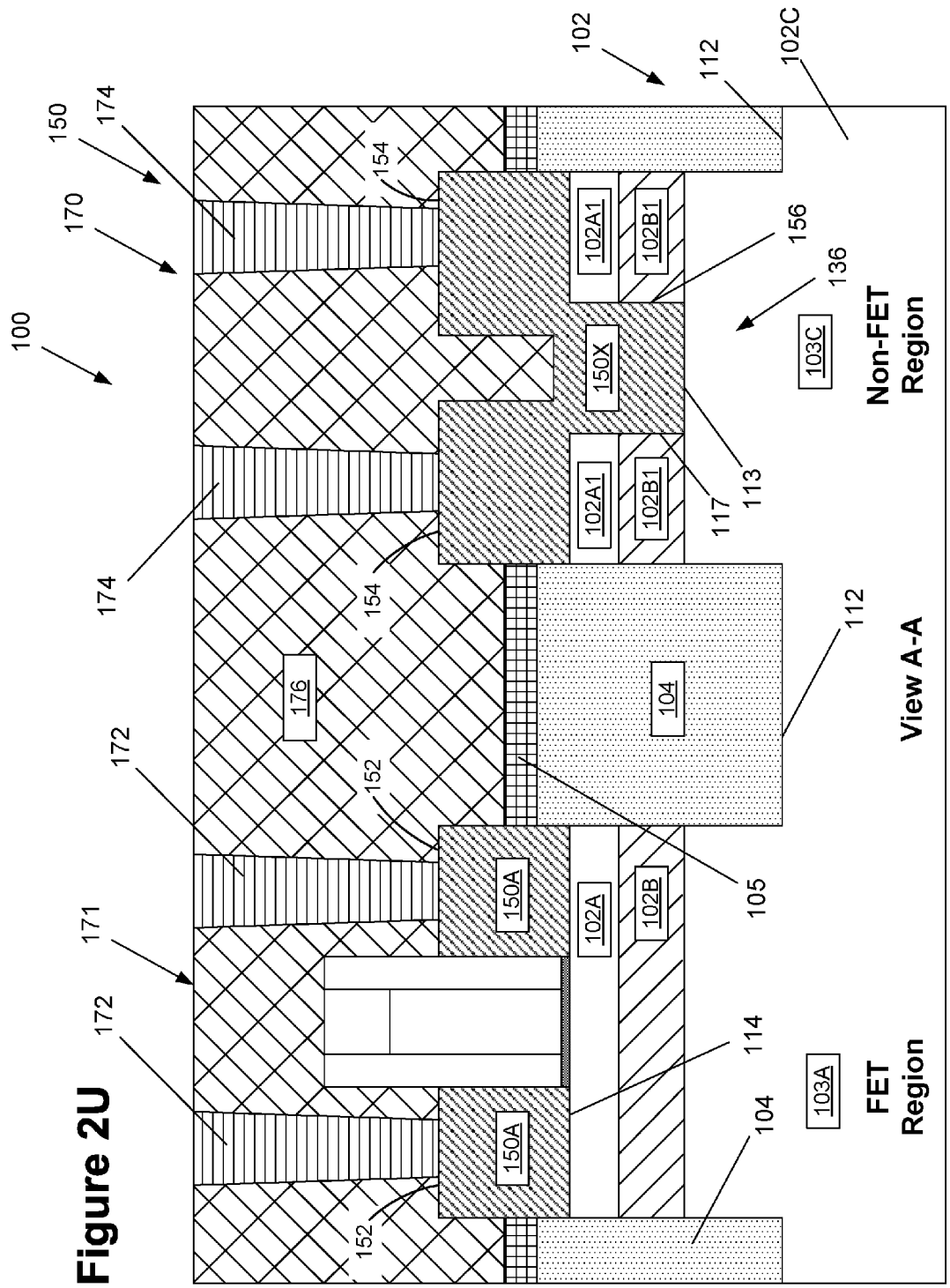

METHODS OF FORMING FIELD EFFECT TRANSISTOR (FET) AND NON-FET CIRCUIT ELEMENTS ON A SEMICONDUCTOR-ON-INSULATOR SUBSTRATE

BACKGROUND OF THE INVENTION

1. Field of the Invention

The present disclosure generally relates to the fabrication of integrated circuits, and, more particularly, to various methods of forming field effect transistors (FETs) and at least a portion of a non-FET circuit element on a semiconductor-on-insulator (SOI) substrate.

2. Description of the Related Art

In modern integrated circuits, such as microprocessors, ASICs, storage devices and the like, a very large number of circuit elements, e.g., field effect transistors (FETs), bi-polar transistor devices, junction field effect transistors (JFETs), capacitors, resistors, etc., are formed in and on a restricted chip area. As used herein and in the attached claims, the term "FET device" will refer to devices that have a structure corresponding to that of devices that were once known as MOSFETs (Metal-Oxide-Semiconductor Field Effect Transistors). Of course, the materials of construction and the configurations of such FET devices have changed over time and when reference is made to such devices, the person skilled in the art will appreciate that such reference does not imply any type of limitation as to the materials of construction and/or the particular configurations of such devices. For example, FET devices come in a variety of different configurations, e.g., planar devices, FinFET devices, omega gate devices, gate-all-around (GAA) devices, such as nanowire devices, etc., and they may be formed with polysilicon gate electrodes or gate electrodes comprised of one or more layers of metal. The FET devices may be manufactured using so-called replacement-gate or "gate-first" manufacturing techniques. Irrespective of their precise form or configuration, these FET devices are typically operated in a switched mode, that is, these devices exhibit a highly conductive state (on-state) and a high impedance state (off-state). The state of a field effect transistor is controlled by a gate electrode, which controls, upon application of an appropriate control voltage, the conductivity of a channel region that forms in the semiconductor substrate under the gate electrode between a drain region and a source region. A layer of insulating material separates the gate electrode from the semiconductor substrate.

In contrast to FET devices, integrated circuits may also include other types of non-FET circuit elements such as, for example, horizontal and vertical bipolar transistor devices, junction field effect transistors (JFETs), capacitors, resistors, diodes, well contacts or well taps, etc. As used herein and in the claims, the term a "non-FET circuit element" means any type of circuit element that is not a FET device. Many current day integrated circuit products include both FET devices and non-FET circuit elements. For example, some IC products include fully depleted or partially depleted FETs, as well as non-FET circuit elements, such as bipolar transistors. These IC products are sometimes formed on so-called SOI substrates (Semiconductor-On-Insulator substrates). However, the formation of both FET devices and non-FET circuit elements on an SOI substrate is not without problems.

FIG. 1A depicts an illustrative SOI substrate 12 wherein a FET device will be formed in a FET region of the substrate 12 and a non-FET circuit element will be formed in a non-FET region of the substrate 12. In general, the SOI substrate 12 is comprised of an active semiconductor layer 12A, a bulk semiconductor layer 12C and a buried insulation layer 12B (sometimes referred to as a "BOX" layer) positioned between the active layer 12A and the bulk layer 12C. The FET device will be formed in and above the active layer 12A in the FET region, while the non-FET circuit element will be formed in and above the bulk layer 12C in the non-FET region of the substrate 12. The thickness of the active layer 12A may vary depending upon whether or not the FET device is intended to be a fully depleted device or a partially depleted device. The techniques used to form such SOI substrates 12 are well known to those skilled in the art.

FIG. 1A depicts the illustrative SOI substrate 12 after an illustrative layer of insulating material 14 (e.g., a pad oxide layer) was formed above the active layer 12A. FIG. 1B depicts the substrate 12 after one or more etching processes were performed though a patterned etch mask, e.g., a patterned layer of photoresist, to remove the active layer 12A and the BOX layer 12B from above the non-FET region. As depicted, this process operation exposes the upper surface 13 of the bulk layer 12C in the non-FET region. At this point, various process operations may be performed to form the non-FET circuit element (not shown) in and above the bulk layer 12C in the non-FET region, and to form the FET device (not shown) in and above the active layer 12A in the FET region of the substrate 12. Unfortunately, using this manufacturing technique, there is a significant height difference, e.g., 10-200 nm (depending upon the particular application), between the upper surface 13 of the bulk layer 12C and the upper surface 12S of the active layer 12A. The existence of such significant changes in the topography of the overall substrate 12 can be problematic for many subsequent manufacturing operations that are performed to create the final integrated circuit problem. For example, such topography changes can make the formation of accurate patterned photoresist masks more challenging due to depth of focus issues caused by such topography changes. Additionally, such topography changes can make the formation of conductive contacts to both the FET devices and the non-FET element more challenging in that, due to the height difference 15, the overall height (or length) of the conductive contacts that contact the non-FET circuit element is greater than the conductive contacts that contact the FET device.

FIG. 1Cs depict a prior art technique that was employed in an effort to reduce or eliminate the topography problem noted above with respect to FIG. 1B. As shown in FIG. 1C, starting with the SOI substrate shown in FIG. 1B, a layer of undoped epi semiconductor material 16 was formed on the exposed upper surface 13 of the bulk layer 12C. The intent of this process was that the epi semiconductor material 16 would be formed in such a manner that its upper surface 16S would be substantially coplanar with the upper surface 12S of the active layer 12A. Unfortunately, during the epi growth process, the epi semiconductor material 16 also grows from the side surface 12X of the active layer 12A. As a result, it was frequently the case that simplistically depicted protrusions or irregularities 16X of the semiconductor material 16 would form at or near the interface between the semiconductor material 16 and the edge of the active layer 12A. The presence of such protrusions 16X required the performance of additional process operations to remove them (either partially or completely). In the case where the protrusions 16X could not be completely removed, their presence had a tendency to reduce the performance of the IC product formed on the substrate 12. Another problem with this approach is that the non-FET regions are typically very large and therefore increase the cost of production due to the requirement to deposit the epi semiconductor material 16 in these relatively large areas.

The present disclosure is directed to various methods of forming field effect transistors (FETs) and at least a portion of a non-FET circuit element on a semiconductor-on-insulator (SOI) substrate that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming field effect transistors (FETs) and at least a portion of a non-FET circuit element on a semiconductor-on-insulator (SOI) substrate. One illustrative method disclosed includes, among other things, forming an isolation structure so as to define first and second active regions on the SOI substrate, forming a field effect transistor above the first active region and forming an opening in the second active region that exposes an upper surface of the bulk semiconductor layer in the second active region. In this example, the method further includes performing a common epitaxial growth process so as to form an epi semiconductor material region above each of the source/drain regions of the transistor and to form a unitary epi semiconductor structure above the second active region, wherein the unitary epi semiconductor structure is formed on and in contact with the exposed upper surface of the bulk semiconductor layer within the opening and on and in contact with an upper surface of the active layer in the second active region.

One illustrative integrated circuit product disclosed herein includes, among other things, an isolation structure that defines first and second active regions on the SOI substrate, a field effect transistor positioned above the first active region and an opening defined in the second active region that extends to an upper surface of the bulk semiconductor layer in the second active region. In this example, the product also includes an epi semiconductor material region positioned above each of the source/drain regions of the transistor and a unitary epi semiconductor structure positioned above the second active region. In this example, the unitary epi semiconductor structure has an upper portion and a lower portion, wherein a lower surface of the lower portion is positioned on and in contact with the upper surface of the bulk semiconductor layer within the opening, a lower surface of the upper portion is positioned on and in contact with the active layer in the second active region and an upper surface of the epi semiconductor material region located above the source region and the drain region and an upper surface of the upper portion of unitary epi semiconductor structure are all positioned at substantially a same height level relative to an upper surface of the active layer.

BRIEF DESCRIPTION OF THE DRAWINGS

The disclosure may be understood by reference to the following description taken in conjunction with the accompanying drawings, in which like reference numerals identify like elements, and in which.

Figure 1A:
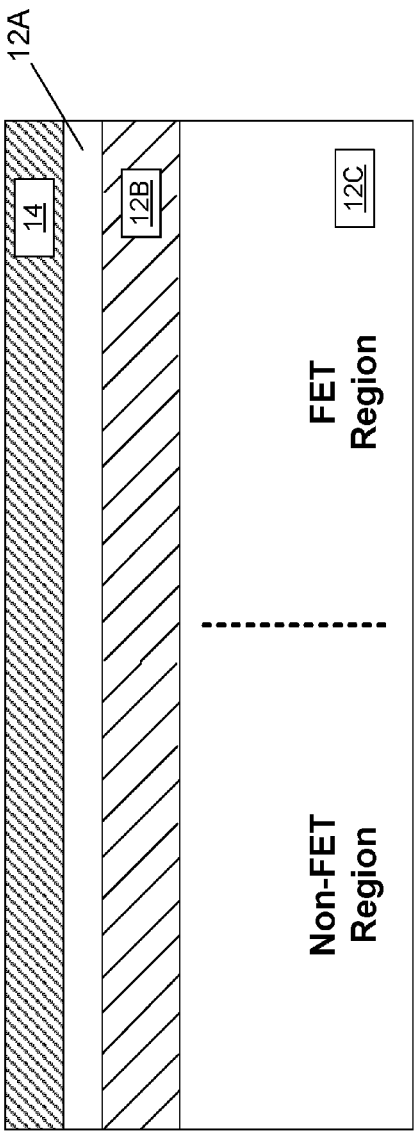
FIGS. 1A-1C depict various prior art techniques for forming field effect transistors (FETs) and non-FET circuit elements on a semiconductor-on-insulator (SOI) substrate.
Figure 1B:
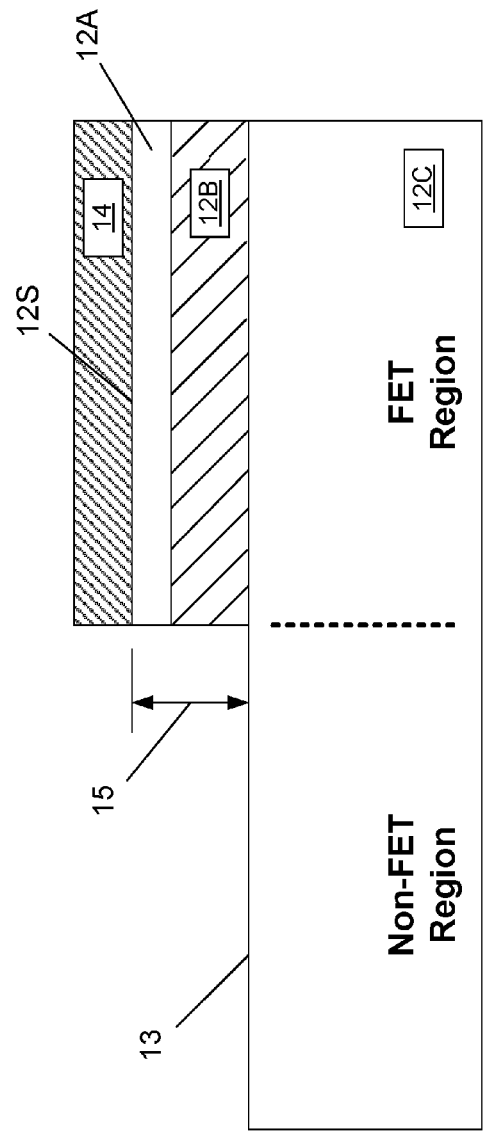
Figure 1C:
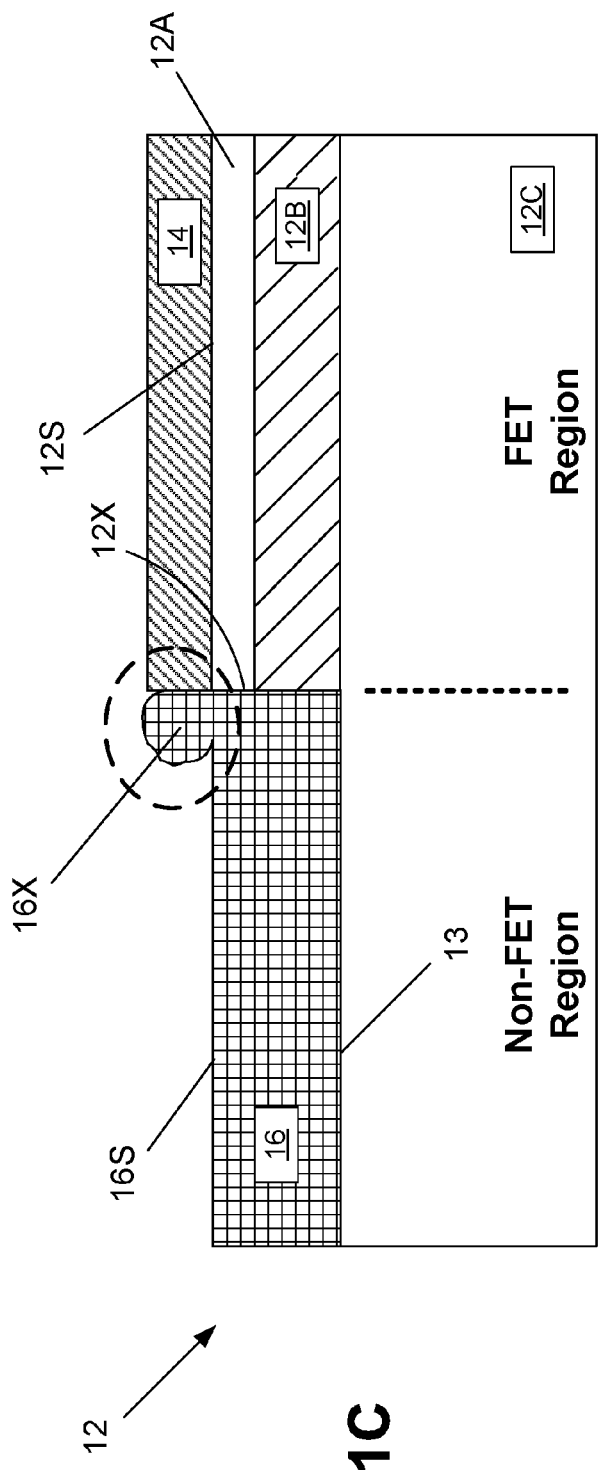

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various novel methods disclosed herein for forming field effect transistors (FETs) and at least a portion of a non-FET circuit element on a semiconductor-on-insulator (SOI) substrate. The methods and devices disclosed herein may be employed in manufacturing products using a variety of technologies, e.g., NMOS, PMOS, CMOS, etc., and they may be employed in manufacturing a variety of different integrated circuit products, e.g., memory products, logic products, ASICs, etc. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 2A:
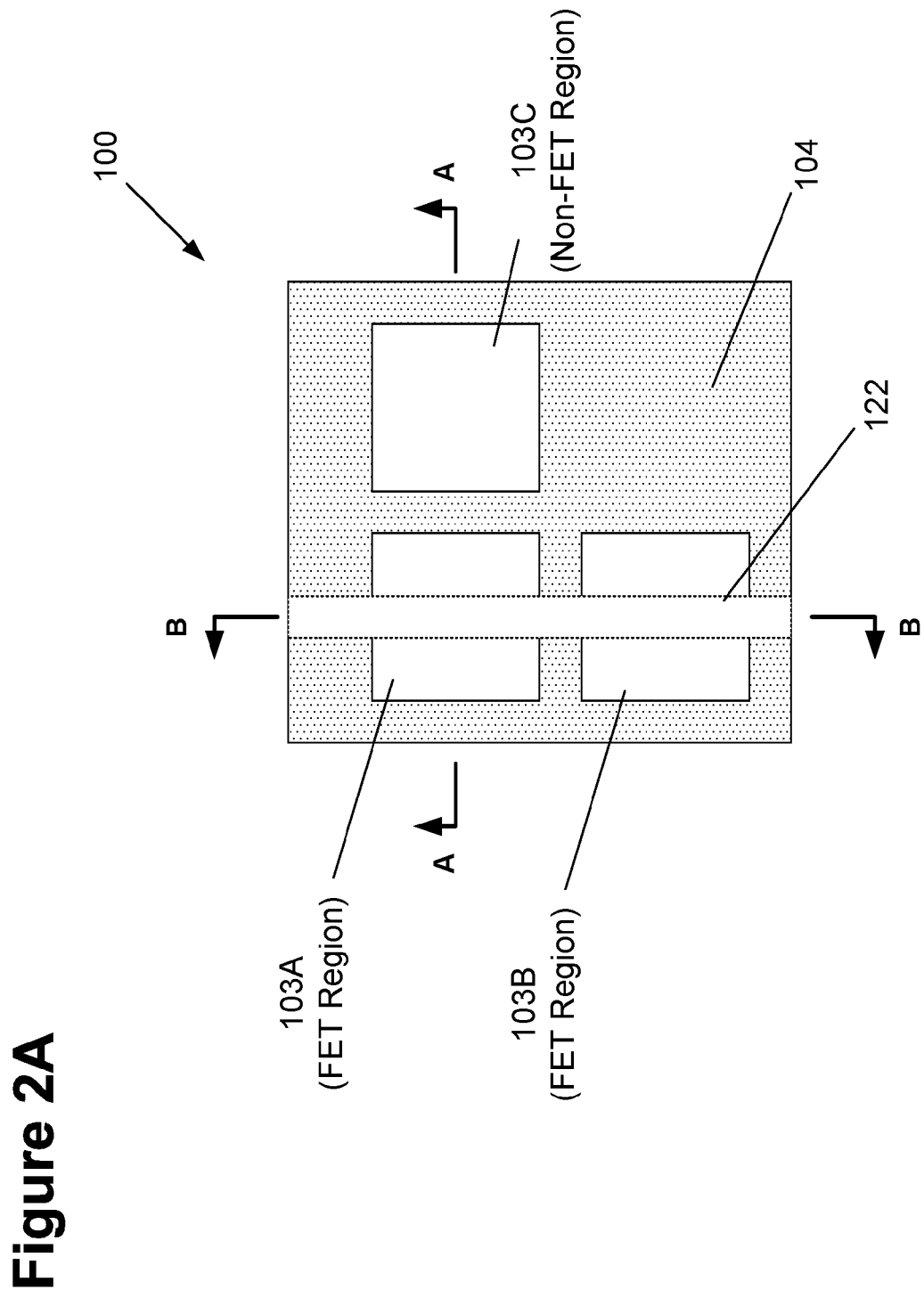
FIGS. 2A-2U depict various novel methods disclosed herein for forming field effect transistors (FETs) and at least a portion of a non-FET circuit element on a semiconductor-on-insulator (SOI) substrate.
Figure 2B:
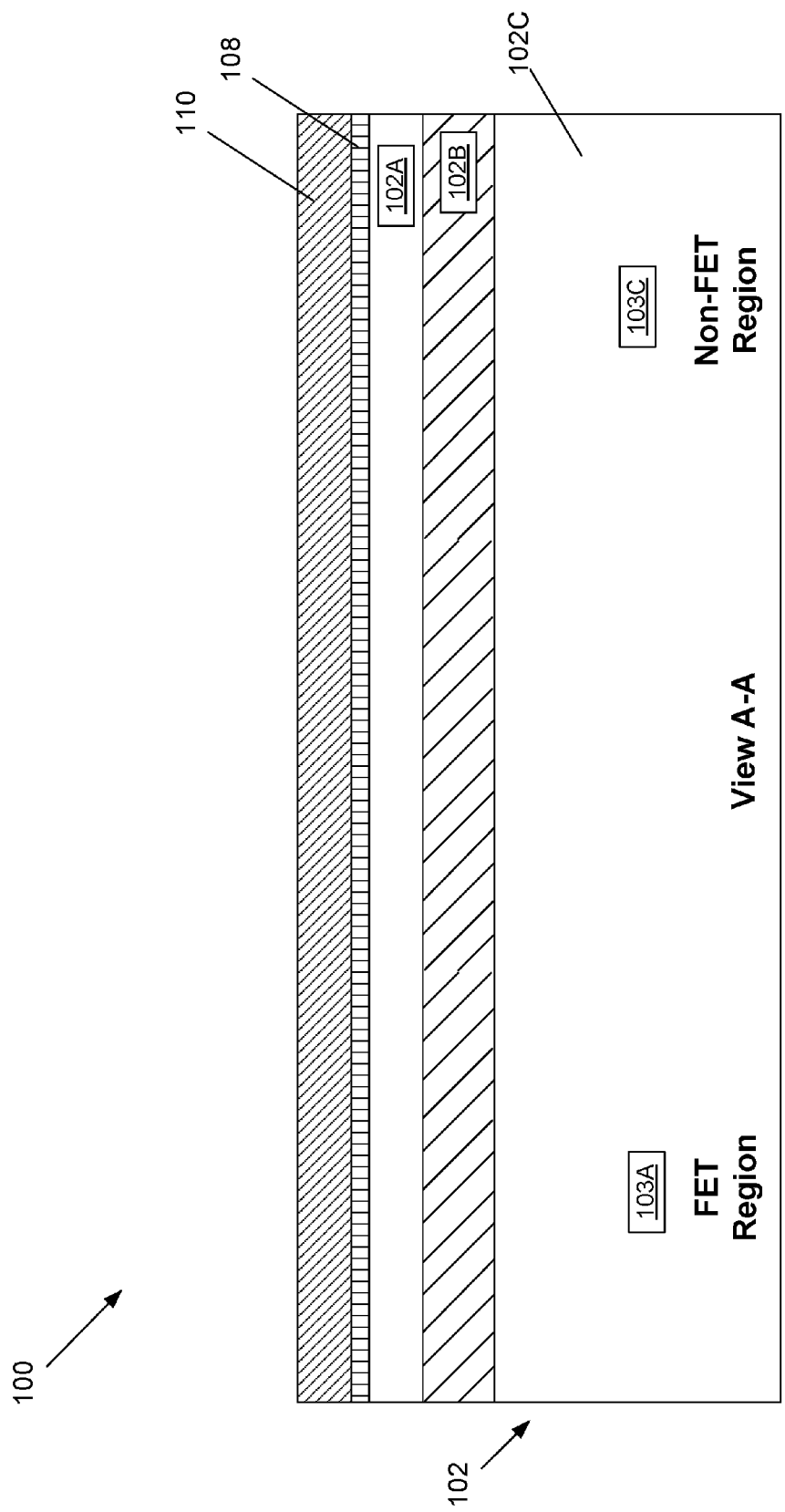

FIGS. 2A-2U depict various novel methods of forming field effect transistors (FETs) and at least a portion of a non-FET circuit element on a semiconductor-on-insulator (SOI) substrate. With reference to FIGS. 2A-2B, the illustrative integrated circuit (IC) product 100 will be formed above an SOI substrate 102. The product 100 will be depicted as comprising an illustrative FET device 171 (see FIG. 2R) that is formed in and above a FET region of the substrate 102 and at least a portion of a non-FET circuit element 170 (see FIG. 2R) that is formed in and above a non-FET region of the substrate 102. As mentioned above, the term "FET device" will refer to transistor devices that have a structure corresponding to that of transistor devices that were once known as MOSFETs (Metal-Oxide-Semiconductor Field Effect Transistors), e.g., planar devices, FinFET devices, omega gate devices, gate-all-around (GAA) devices, such as nanowire devices, etc. Of course, the materials of construction and the configurations of such FET devices have changed over time and when reference is made to such devices, the person skilled in the art will appreciate that such reference does not imply any type of limitation as to the materials of construction and/or the particular configurations of such devices. The FET devices may be formed with polysilicon gate electrodes or gate electrodes comprised of one or more layers of metal and they may be manufactured using so-called replacement gate manufacturing techniques or so-called gate first manufacturing techniques. Such FET devices will comprise at least the following components: a gate electrode, which controls, upon application of an appropriate control voltage, the conductivity of a channel region that forms in a semiconductor material under the gate electrode between a drain region and a source region and a layer of insulating material that separates the gate electrode from the semiconductor material. As noted above, and as will be used in the claims attached hereto, the term a "non-FET circuit element" means any type of circuit element that is not a FET device, e.g., a bipolar transistor, a capacitor, a resistor, diodes, well contacts or well taps, etc.

In general, the SOI substrate 102 is comprised of an active semiconductor layer 102A, a bulk semiconductor layer 102C and a buried insulation layer 102B (sometimes referred to as a "BOX" layer) that is positioned between the active layer 102A and the bulk layer 102B. The FET device 171 will be formed in and above the active layer 102A in the FET region, while the non-FET circuit element 170 (or at least a portion thereof) will be formed in and above the active layer 102A and the bulk layer 102C in the non-FET region of the substrate 102. The thickness of the active layer 102A may vary depending upon whether or not the FET device 171 is intended to be a fully depleted device or a partially depleted device. The active layer 102A may be comprised of one or more of any of a variety of different semiconductor materials, e.g., silicon, silicon germanium, germanium, carbon, silicon carbon, any III-V combination material, etc. In some applications, the active layer 102A may be entirely comprised of a single semiconductor material, e.g., silicon or silicon germanium, while, in other applications, the active layer 102A may be comprised of regions of different semiconductor materials. Similarly, the bulk layer 102C may be comprised of any of a variety of different semiconductor materials, and the BOX layer 102B may be comprised of any of a variety of different insulating materials, e.g., silicon dioxide, etc. The thickness of the BOX layer 102B may also vary depending upon the particular application. In one illustrative embodiment, the bulk layer 102C may be silicon, the BOX layer 102B may be comprised of silicon dioxide, and the active layer 102A may be comprised of regions of silicon and regions of silicon-germanium. The techniques used to form such SOI substrates 102 are well known to those skilled in the art.

With continuing reference to FIG. 2A, in the depicted example, the FET region of the substrate 102 is comprised of two spaced-apart active regions 103A-B, while the non-FET region of the substrate 102 is comprised of a single active region 103C. A FET device will be formed in and above each of the active regions 103A-B, while at least a portion of a non-FET circuit element will be formed in and above the active region 103C. As depicted in dashed lines, a gate structure 122 for the FinFET device 171 will eventually be formed that spans across the active regions 103A-B. The size and configurations of the active regions 103A-C may vary and they need not all have the same configuration (when viewed from above), although such a situation is possible in some applications. As depicted in FIG. 2A, the view A-A is a cross-sectional view taken through the active region 103A (in the FET region) and the active region 103C (in the non-FET region), while the view B-B is a cross-sectional view that will be taken through both of the active regions 103A-103B in the FET region of the substrate 102.

FIG. 2B depicts the IC product 100 at a point in fabrication wherein a first layer of insulating material 108, e.g., a pad oxide layer, was formed on the active layer 102A, and a second layer of insulating material 110, e.g., a pad nitride layer, was formed on the first layer of insulating material 108. The thickness of the layers 108, 110, as well as the materials of construction for each of the layers 108, 110 may vary depending upon the particular application.

FIG. 2C depicts the product 100 after one or more etching processes were performed through a patterned etch mask (not shown), e.g., a patterned layer of photoresist, so as to define a plurality of isolation trenches 112 that extend into the bulk layer 102C. The depth and width of the trenches 112 may vary depending upon the particular application. In one illustrative embodiment, the trenches 112 are formed so as to form shallow trench isolation (STI) structures on the product 100.

Figure 2D:
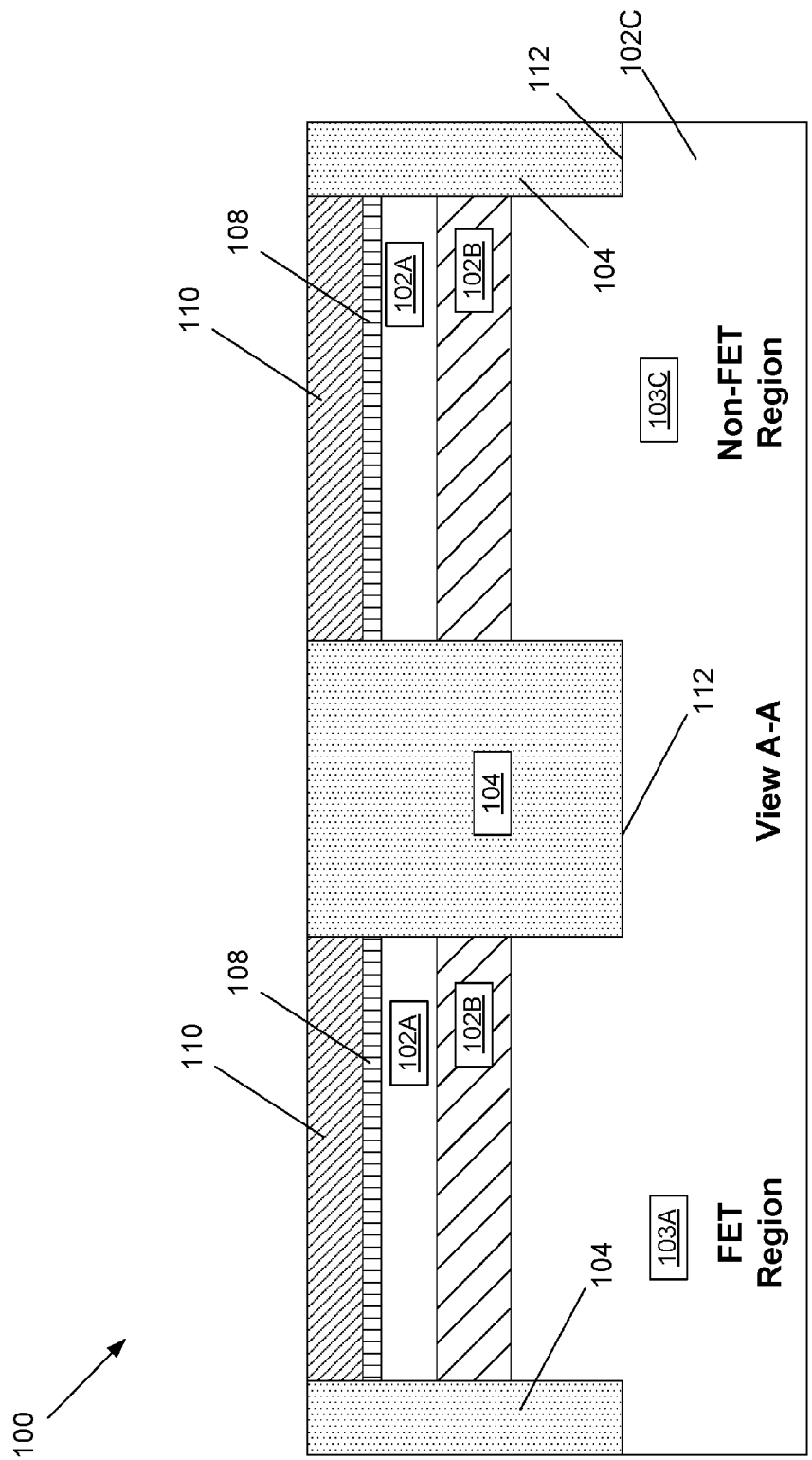

FIG. 2D depicts the IC product 100 after several process operations were performed. First, a layer of insulating material (e.g., silicon dioxide) was deposited above the substrate 102 so as to overfill the trenches 112. Thereafter, a chemical mechanical polishing process was performed using the second layer of insulating material 110 as a polish-stop. These operations result in the formation of illustrative isolation regions 104, e.g., STI regions, that electrically isolate the active regions 103A-C (and the devices formed thereon) from one another. At the point of fabrication depicted in FIG. 2D, various ion implantation processes may be performed to form various doped regions in the bulk layer 102C in any or all of the active regions 103A-C. For example, deep and shallow well regions N-back-plane and/or P-back-plane regions for back-gate control, etc., (not shown) may be formed in the active regions 103A-B, and these well regions may be doped with P or N type dopants depending upon the nature of the FET device (e.g., N-type or P-type) formed above the active regions 103A-B. In some cases, depending upon the nature of the non-FET circuit element, only some of the well regions formed in the active regions 103A-B will be formed in the active region 103C, e.g., only a deep well region may be formed in the active region 103C. Various patterned ion implantation masks may be employed in forming the well regions discussed above. The techniques used to form such doped well regions are well known to those skilled in the art and such doped regions are not depicted in the drawings so as not to obscure the subject matter disclosed herein.

FIG. 2E depicts the product 100 after a timed, recessed etching process was performed on the isolation region 104. In one illustrative embodiment, at the conclusion of the recess etching process, the recessed upper surface 104R of the isolation region 104 is positioned at a level that is between the upper surface 108S of the insulating material 108 and the upper surface 110S of the insulating material 110. The recessing of the isolation region 104 defines an isolation recess 104X located above the recessed isolation region 104. The depth of the isolation recess 104X may vary depending upon the particular application.

FIG. 2F depicts the IC product 100 after several process operations were performed.

First, a layer of cap material was deposited above the substrate 102 so as to overfill the isolation recess 104X. Thereafter, a chemical mechanical polishing process was performed using the second layer of insulating material 110 as a polish-stop. These operations result in the formation of an illustrative isolation cap layer 105 positioned in the isolation recess 104X above the isolation region 104. As depicted, upon completion of the CMP process, the upper surface 105S of the isolation cap layer 105 is substantially coplanar with the upper surface 110S of the second layer of insulating material 110. The isolation cap layer 105 may be comprised of a variety of different materials, e.g., amorphous carbon, a low-k material (k value less than 3.3), silicon carbon, etc. In general, the isolation cap layer 105 may be made of a material such that it can protect the underlying isolation region 104 during subsequent etching processes performed on the product, as discussed more fully below.

Figure 2G:
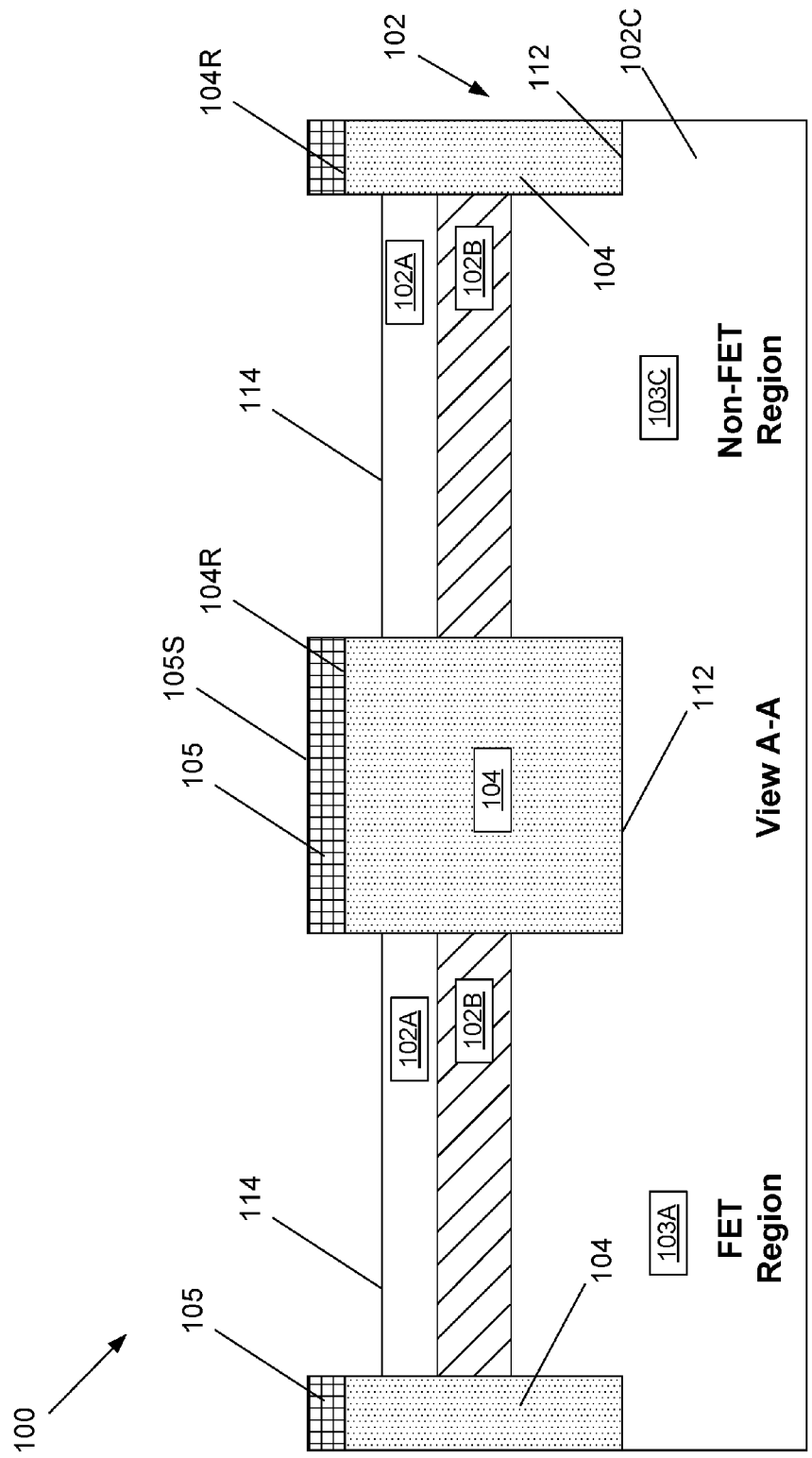

FIG. 2G depicts the product 100 after one or more etching processes were performed to remove the second layer of insulating material 110 and the first layer of insulating material 108 so as to thereby expose the upper surface 114 of the active layer 102A in both the FET region and non-FET region of the substrate 102. In one illustrative embodiment, the layers 108, 110 may be removed by performing one or more dry anisotropic etching processes. Note that the isolation cap layer 105 protects the underlying recessed isolation region 104 during these etching processes.

Figure 2I:
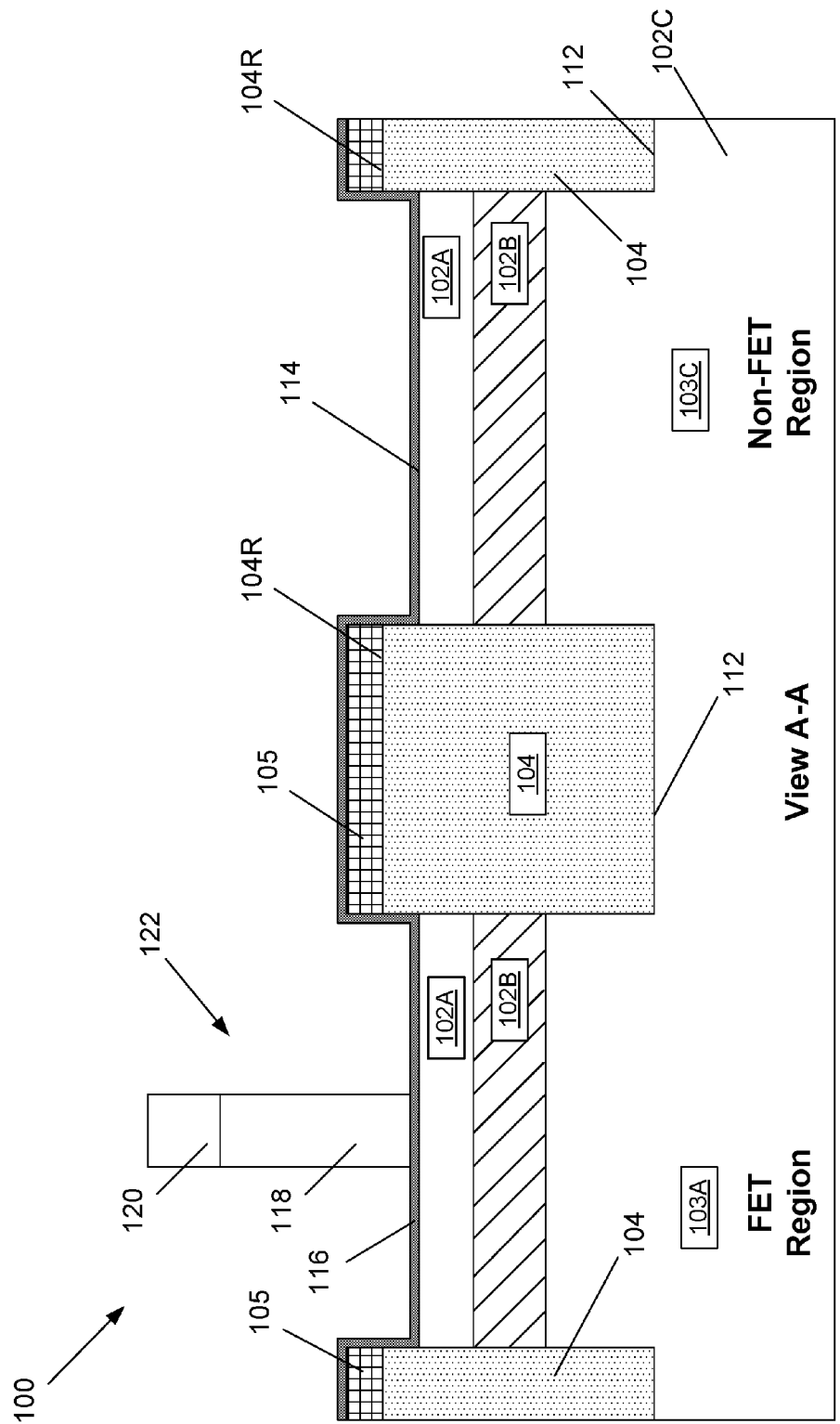

FIGS. 2H-2J depict the IC product 100 after several process operations were performed. FIG. 2H depicts the product after a layer of gate insulating material 116, a layer of gate electrode material 118 and a layer of gate cap material 120 was formed across the entire substrate 102, i.e., covering all of the active regions 103A-103C as well as all of the isolation cap layer 105. As noted above, the gate structure for the IC product 100 may be manufactured using gate-first manufacturing techniques or replacement gate manufacturing techniques. Thus, the gate insulation material 116 may be comprised of a material such as silicon dioxide or a high-k (k value greater than 10) material, such as hafnium oxide (or other high-k materials), while the gate electrode material layer 118 may be comprised of polysilicon, amorphous silicon or one or more conductive material layers, such as one or more layers of metal or metal alloys. The vertical thickness of the gate electrode material layer 118 may vary depending upon the particular application. The layer of gate cap material 120 may also be formed of a variety of different materials, e.g., silicon nitride, and its thickness may vary depending upon the particular application.

FIGS. 2I and 2J depict the product 100 after one or more etching processes were performed through a patterned masking layer (not shown) to define the basic overall configuration of the gate structure 122 with the gate cap layer 120 positioned above the gate electrode 118. FIG. 2I is a cross-sectional view (view A-A) taken through the gate structure 122 (and the active regions 103A and 103C) in a direction that is parallel to the direction of current transport in the FET device when it is in operation, i.e., in the gate-length direction of the FET device. FIG. 2J is a cross-sectional view (view B-B) taken through the gate structure 122 (and the active regions 103A and 103B) in a direction that is transverse to the direction of current transport in the FET device when it is in operation, i.e., in the gate-width direction of the FET device. As indicated in these drawings, the gate structure 122 is comprised of the now patterned layer of gate electrode material 118 and the portion of the gate insulation layer 116 positioned under the patterned gate electrode 118. With reference to FIG. 2J, also depicted is a region 126 where the gate structure 122 will subsequently be "cut" or removed so as to define separate gate structures that extend across the active regions 103B, 103A, as described more fully below.

At the point of fabrication depicted in FIG. 2I (i.e., after formation of the gate structure 122), various ion implantation processes may be performed to form various doped regions in the active layer 102A in the active regions 103A-B, e.g., source/drain extension regions, halo implant regions, and the like. Additionally, if desired, various doped region may be formed in the active layer 102A in the active region 103C. The doped region(s), if any, in the active region 103C may be different from those formed in the active regions 102A-B. The techniques used to form such doped well regions are well known to those skilled in the art and such doped regions are not depicted in the drawings so as not to obscure the subject matter disclosed herein.

Figure 2K:
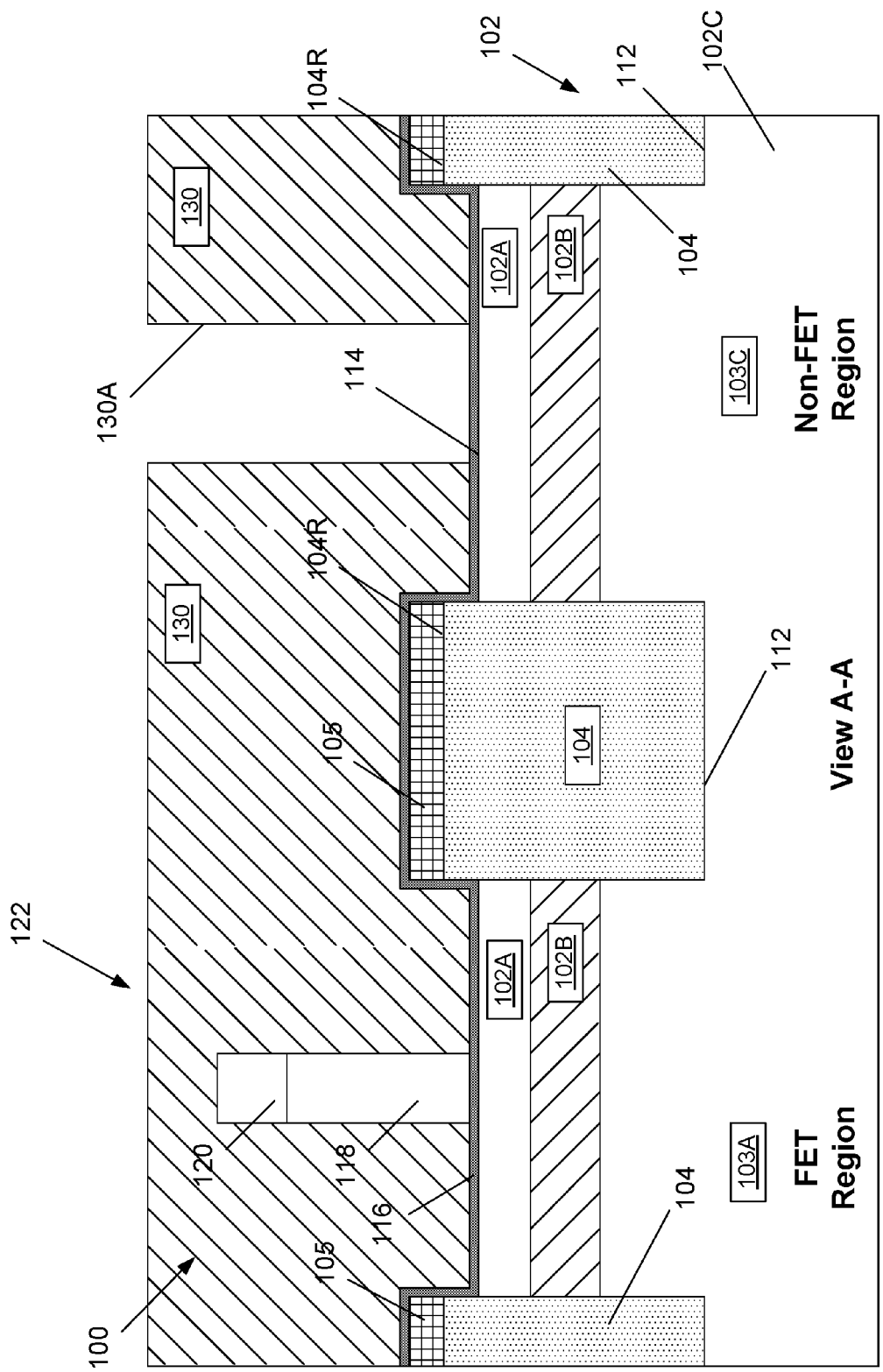
Figure 2L:
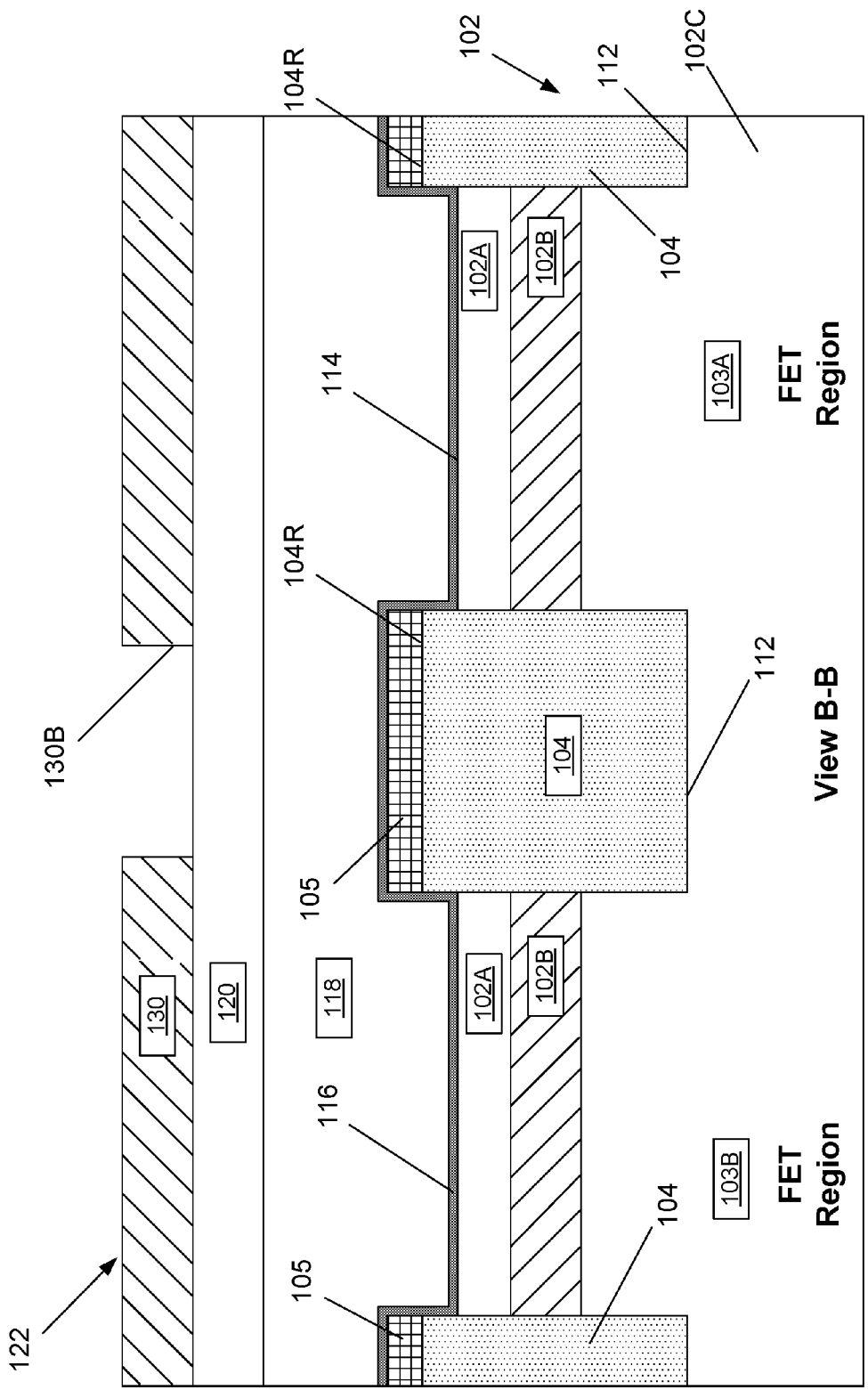
Figure 2M:
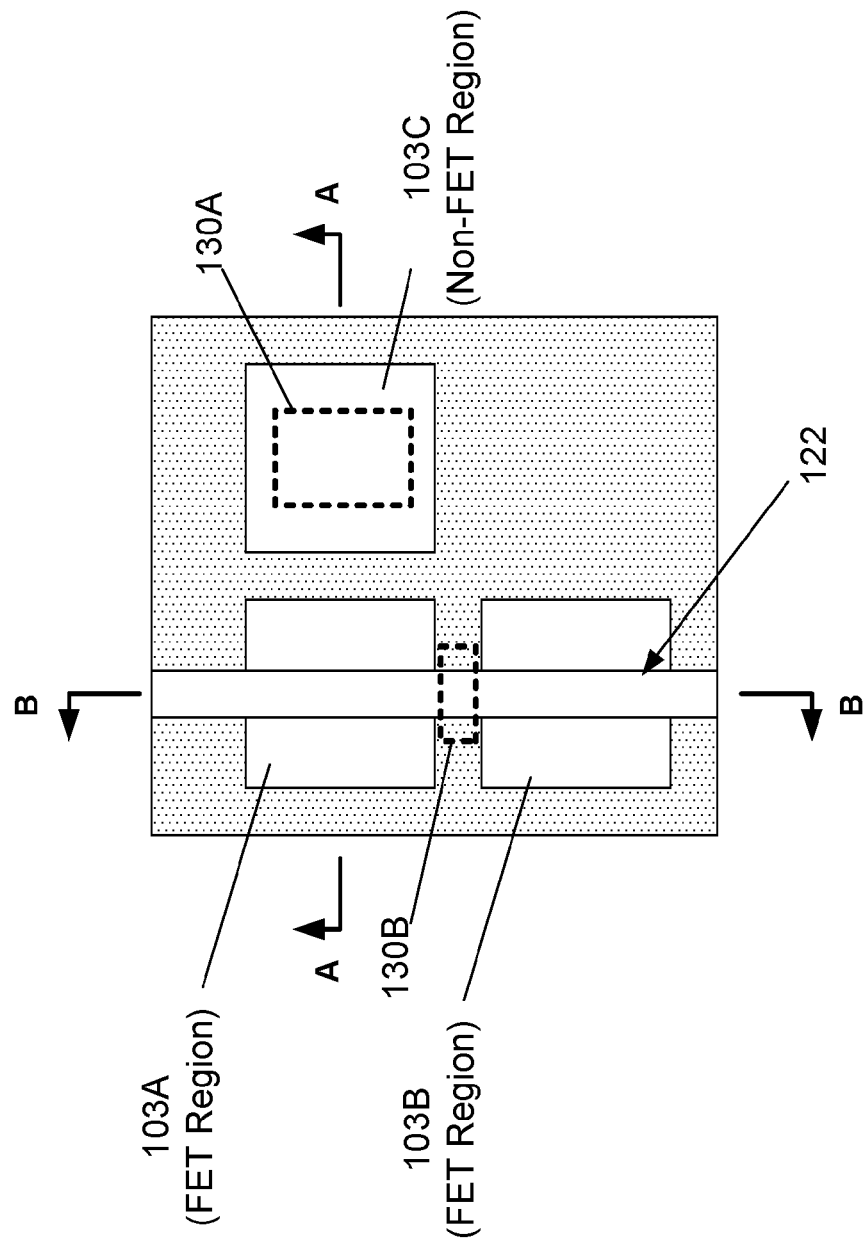

FIG. 2K (view A-A), FIG. 2L (view B-B) and FIG. 2M (plan view) depict the IC product 100 after several process operations were performed. First, a patterned etch mask 130, e.g., a cut mask, was formed across the entire substrate 102. The patterned etch mask 130 may be comprised of a variety of different materials, such as a patterned layer of photoresist that is formed using traditional photolithography tools and techniques. As shown in FIGS. 2K-2M, the patterned etch mask 130 has a first opening 130A and a second opening 130B. The first opening 130A is located above the active region 103C (in the non-FET circuit element region of the substrate 102). The second opening 130B is located so as to allow cutting of the gate structure 122 between the active regions 103A, 103B in the FET region of the substrate 102.

Figure 2N:
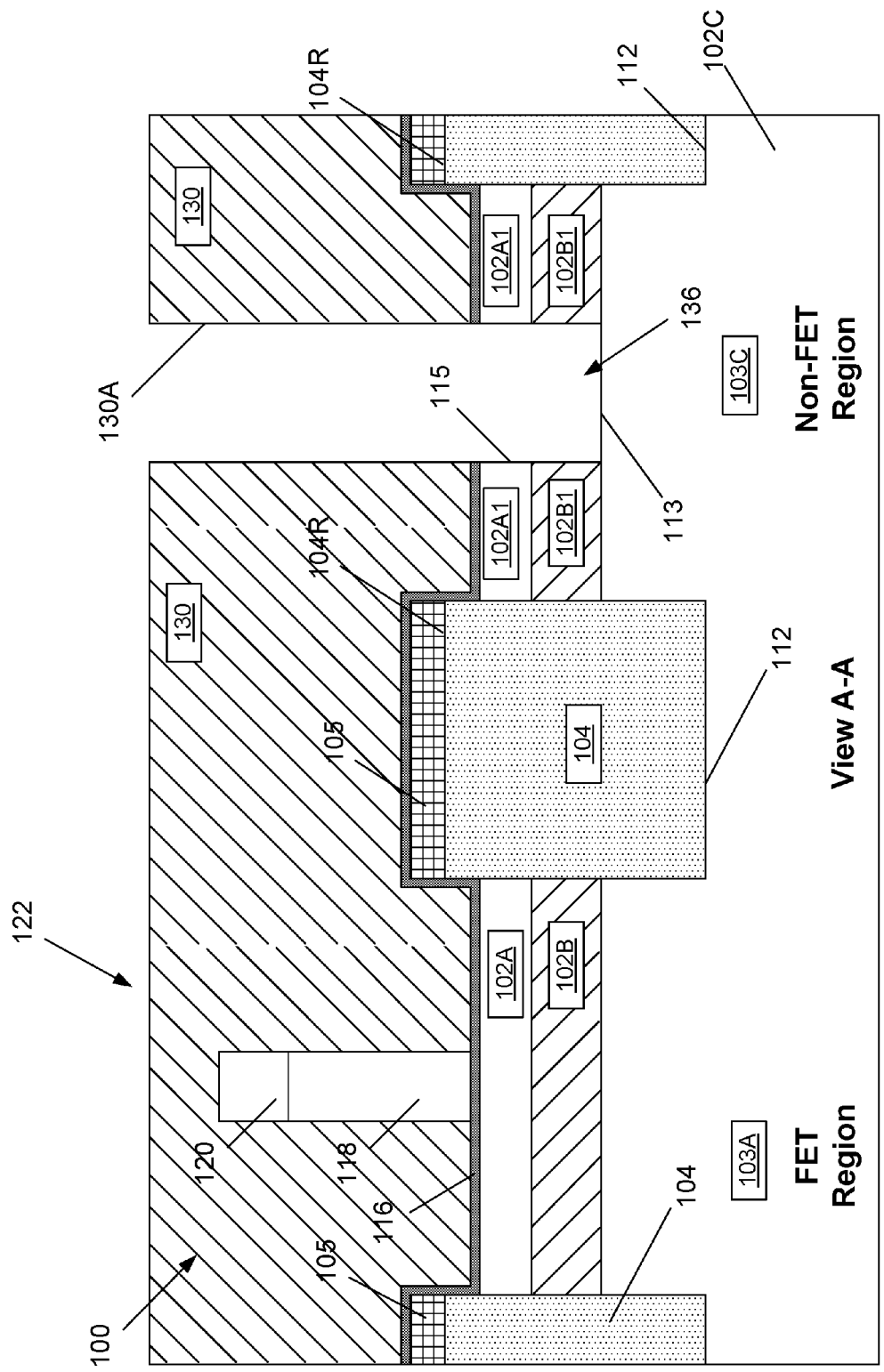
Figure 2O:
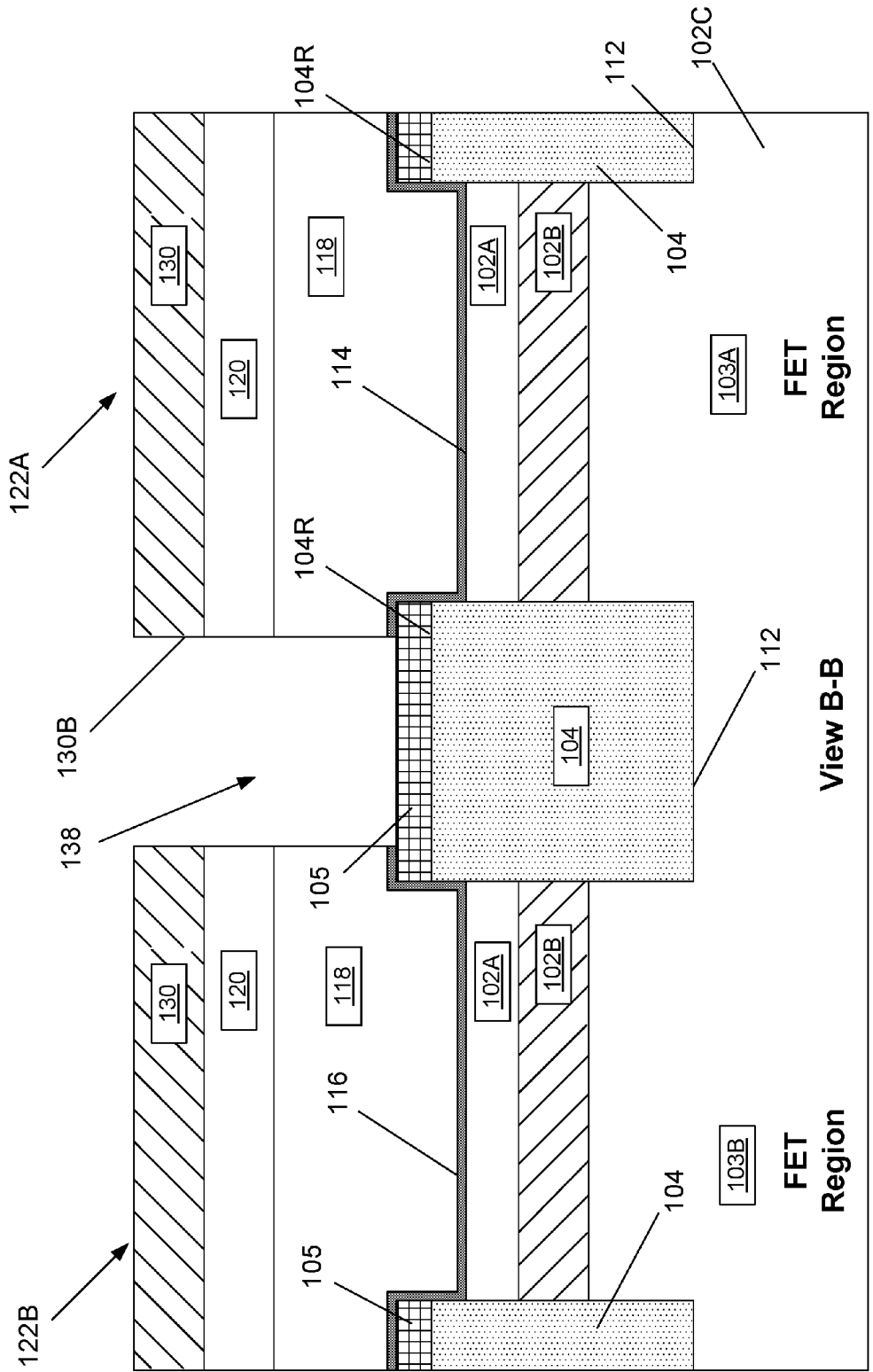

FIG. 2N (view A-A) and FIG. 2O (view B-B) depict the IC product 100 after one or more etching processes were performed through the patterned etch mask 130 so as to cut the gate structure 122 and so as to remove a portion of the active layer 102A and the BOX layer 102B in the active region 103C. More specifically, as shown in FIG. 2N, performing the etching process through the first opening 130A in the patterned etch mask 130 results in the formation of an opening 136 that exposes a portion of the upper surface 113 of the bulk layer 102C in the active region 103C. The formation of the opening 136 essentially forms an opening in the active layer 102A and the BOX layer 102B in the active region 103C. Accordingly, these regions have been re-identified with the reference numbers 102A1 and 102B1 as indicated to facilitate discussion. The side surfaces 115 of the active layer portions 102A1 are exposed by the formation of the opening 136. As shown in FIG. 2O, performing the etching process through the second opening 130B in the patterned etch mask 130 results in the formation of an opening 138 that separates the gate structure 122 into first and second gate structures 122A and 122B positioned above the active regions 103A and 103B, respectively. Note that the etching process performed through the opening 130B stops on the isolation cap layer 105.

FIG. 2P depicts the IC product 100 after several process operations were performed. First, the patterned masking layer 130 was removed. Thereafter, a sidewall spacer 138 was formed adjacent the gate structures 122A, 122B by depositing a layer of spacer material, e.g., silicon nitride, and thereafter performing an anisotropic etching process. At this point, if desired, an implantation process may be performed to form deep source/drain implant regions (not shown) in the active layer 102A in the active regions 103A-B while masking the active region 103C. Then, an etching process, e.g., an anisotropic etching process, was performed to remove the remaining exposed portions of the layer of gate insulating material 116. These process operations expose the upper surface 114 of the active regions 102A and 102A1 as well as the isolation cap layer 105.

Figure 2R:
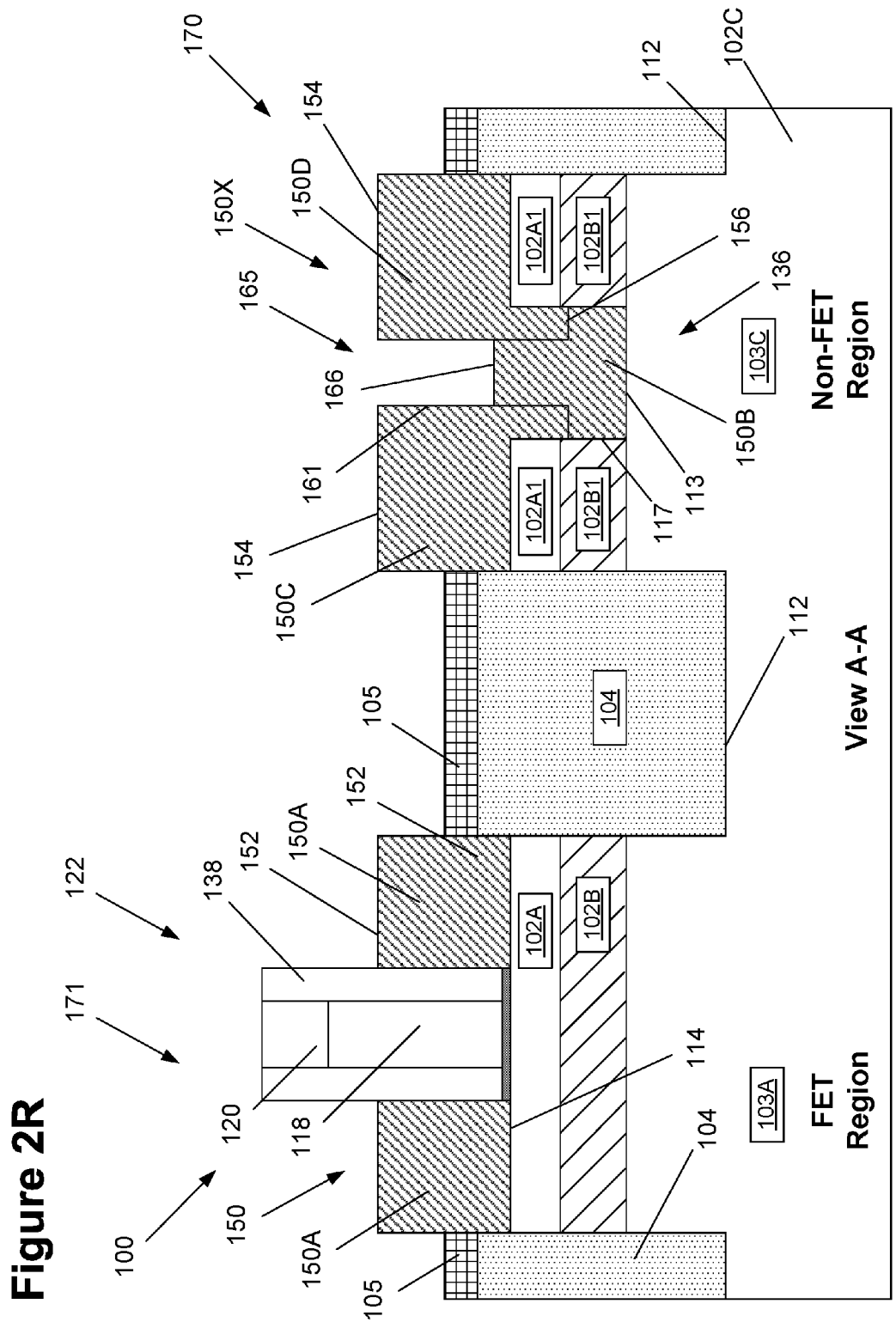

With reference to FIGS. 2Q-2R and 2S (plan view), the next major process operation involves performing a common epitaxial growth process to form doped epi semiconductor material 150 on the active layer 102A adjacent the spacer 138, i.e., above the source/drain regions of the FET device, and to form the doped epi semiconductor material 150 in and above the opening 136 in the active region 103C for the non-FET circuit element at the same time. The semiconductor material 150 may be any type of semiconductor material, e.g., silicon-germanium, silicon, silicon-carbon, carbon, silicon carbon, any III-V combination material, etc., and it may be formed by performing traditional epitaxial growth process operations. In one illustrative example, the epi semiconductor material may be in situ doped with either P-type or N-type dopant material, depending upon the type of FET device (P or N, respectively) under construction. FIG. 2Q depicts the product 100 at a point in time after the formation of the epi semiconductor material 150 has begun to grow, e.g., about mid-point of the epi growth process, while FIG. 2R depicts the product 100 after the formation of the epi semiconductor material 150 was completed.

To facilitate further explanation, a reference number 150A has been added to designate the semiconductor material 150 formed above the active region 103A; a reference number 150B has been added to designate the portion of the semiconductor material 150 that begins growing on the upper surface 113 of the bulk layer 102C exposed by the opening 136; and reference numbers 150C, 150D have been added to designate the portions of the semiconductor material 150 that begins growing on the active region 102A1. Of course, when the epi growth process begins, all of the various portions of semiconductor material 150A, 150B, 150C and 1150D will begin to grow at the same time on different growth surfaces. Additionally, all of the regions of the epi semiconductor material 150, wherever formed, will be comprised of the same semiconductor material and they will have the same dopant concentration (if any) since these regions of epi semiconductor material 150 were formed by performing a common epi growth process operation.

More specifically, as shown in FIG. 2Q, at some time after the epitaxial growth process begins, the semiconductor material 150A begins growing in a substantially vertical direction (as indicated by the arrow 160) using the upper surface 114 of the active layer 102A in the active region 103A as the growth surface. Similarly, at the same time, the semiconductor material 150B begins growing in a substantially vertical direction (as indicated by the arrow 160) using the upper surface 113 of the bulk layer 102C in the active region 103C as the growth surface. Note that the side surfaces 117 of the BOX layer 102B1 do not serve as growth surfaces for the semiconductor material 150B during the epi growth process. The semiconductor regions 150C and 150D grow in two different directions. More specifically, the semiconductor material 150C begins growing in a substantially vertical direction (as indicated by the arrow 160) using the upper surface 114 of the active layer 102A1 in the active region 103C as the growth surface, and it also grows in a substantially horizontal direction (as indicated by the arrow 162) using the side surface 115 of the active layer 102A1 as the growth surface. Similarly, the semiconductor material 150D begins growing in a substantially vertical direction (as indicated by the arrow 160) using the upper surface 114 of the active layer 102A1 in the active region 103C as the growth surface, and it also grows in a substantially horizontal direction (as indicated by the arrow 162) using the side surface 115 of the active layer 102A1 as the growth surface. In general, as the growth process continues through completion, the upper surface 152 of the semiconductor material 150A and the uppers surfaces 154 of the semiconductor materials 150C and 150D should be at substantially the same height level above the upper surface 114 of the active layers 102A and 102A1. At the point in time of the of the epi growth process depicted in FIG. 2Q, the upper surface 156 of the semiconductor portion 150B has not contacted the lower surfaces 158 of the semiconductor materials 150C and 150D.

Figure 2T:
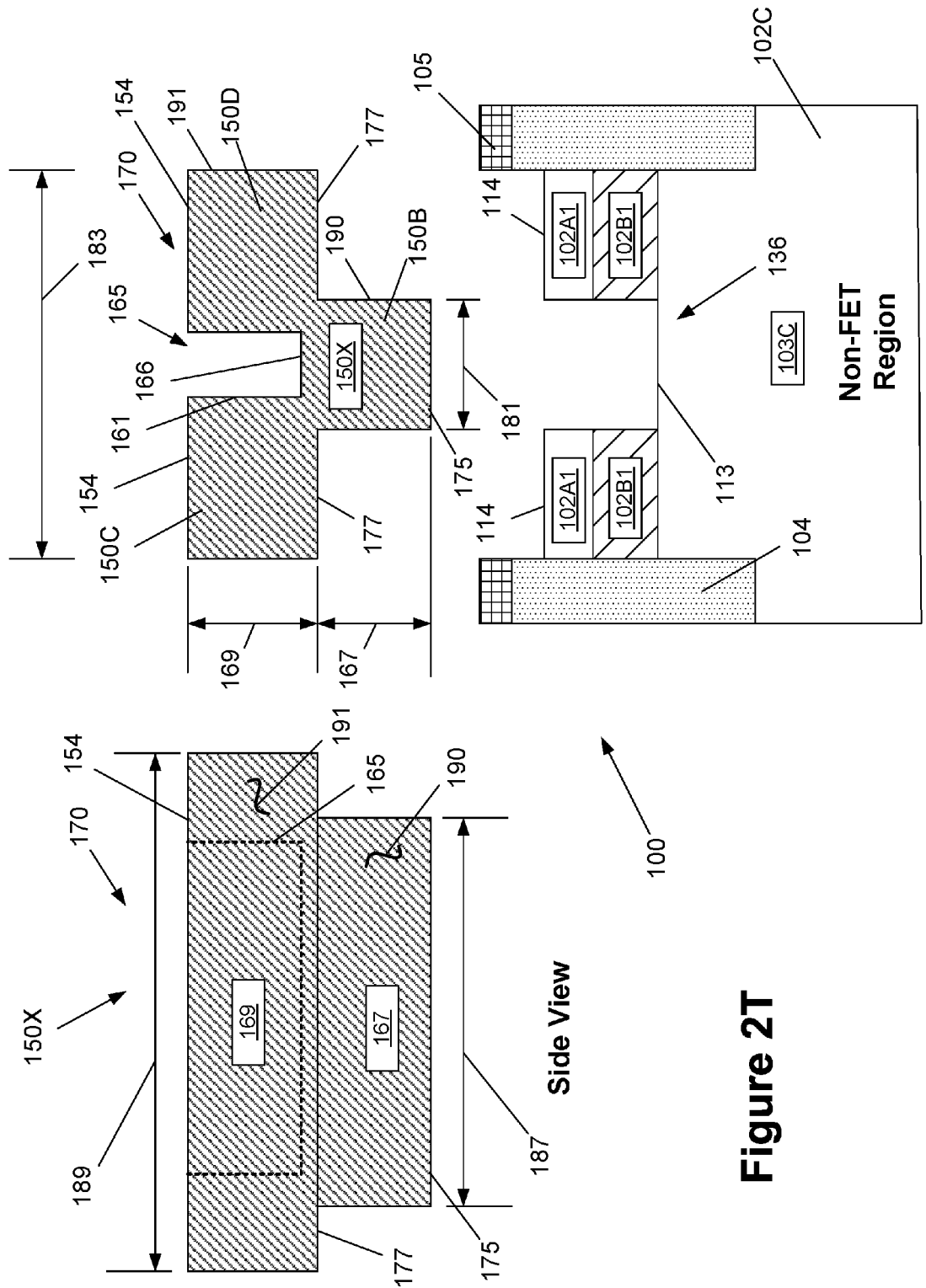

FIGS. 2R (cross-sectional view) and 2S (plan view) depict the product 100 at the completion of the epi growth process that forms the epi semiconductor material 150. To facilitate discussion, the semiconductor regions 150B, 150C and 150D are depicted as being separately identifiable regions. However, in a real-world device, the semiconductor regions 150B, 150C and 150D will essentially merge together to form a unitary epi semiconductor structure 150X. An exploded view of the unitary semiconductor structure 150X is depicted in FIG. 2T to further facilitate explanation. As depicted, after the completion of the growth process, the upper surface 152 of the semiconductor material 150A and the upper surface 154 of the unitary semiconductor structure 150X, i.e., the upper surfaces of the semiconductor materials 150C and 150D, are positioned at substantially the same height level above the upper surface 114 of the active layers 102A and 102A1. In the example depicted in FIG. 2R, a recess 165 is formed in the unitary semiconductor structure 150X. The recess 165 is defined by the upper surface 166 of the semiconductor material 150B and the laterally spaced-apart side surfaces 161 of the semiconductor materials 150C and 150D. The physical size of this recess 165 may vary depending upon the particular application.

As depicted in FIG. 2R, using the novel methods disclosed herein, a FET device 171, e.g., a planar transistor, a FinFET transistor, etc., was formed above the active region 103A and at least a portion of a non-FET circuit element 170 was formed above the active region 103C. As noted above, the unitary semiconductor structure 150X may constitute the entirety of a non-FET circuit element 170, such as a resistor, or it may be only a part of a non-FET circuit element 170, e.g., it may constitute a doped emitter region when the non-FET circuit element 170 is a bipolar transistor.

Further aspects of the unitary semiconductor structure 150X and how it is positioned in the active region 103C will be described with reference to FIG. 2T, which contains an exploded view and a side view of the unitary semiconductor structure 150X. As shown therein, the unitary semiconductor structure 150X comprises a lower portion 167 and an upper portion 169. The lateral width 181 of the lower portion 167 is less than the lateral width 183 of the upper portion 169. Additionally, as shown in the side view, the axial length 187 of the lower portion 167 is less than the axial length 189 of the upper portion 169. In the depicted example, the recess 165 is positioned entirely within the upper portion 169, although that may not be the case in all applications. Thus, the unitary semiconductor structure 150X has a stepped profile in both its lateral width and axial length directions. In general, the lower portion 167 of the unitary semiconductor structure 150X is positioned within the opening 136, while the upper portion 169 of the unitary semiconductor structure 150X is positioned above the active layer 102A1 in the active region 103C. More specifically, a lower surface 175 of the lower portion 167 is positioned on and in contact with the upper surface 113 of the bulk layer 102C in the active region 103C and the lower surface 177 of the upper portion 169 is positioned on and in contact with the active layer 102A1 and above the BOX layer 102B1.

FIG. 2U depicts the product 100 after several process operations were performed to form conductive contact structures 172 to the FET device 171 and conductive contact structures 174 to the non-FET circuit element 170. Such conductive contact structures 172, 174 may be formed using traditional manufacturing techniques and materials. However, note that since the upper surfaces 152 of the semiconductor materials 150A in the active region 103A are at substantially the same height level as the upper surfaces 154 of the unitary semiconductor structure 150X in the active region 103C, the formation of contact structures does not present the same uneven topography issues as discussed in the background section of this application. In the depicted example, a plurality of contact structures 172 are formed to contact the semiconductor materials 150A, while another plurality of contacts 174 are provided to contact the unitary semiconductor structure 150X. However, in some applications, a single contact may be made to the unitary semiconductor structure 150X. The contact structures 172, 174 may be point-type contact structures or line-type contact structures and they need not have the same structure. The contact structures 172, 174 may be comprised of one or more barrier/adhesion layers and they may comprise a metal silicide region (not shown) at the point where they engage the semiconductor materials 150A, 150X. In general, the contact structures 172, 174 may be formed by depositing one or more layers of insulating material 176, e.g., silicon dioxide, above the substrate 102, performing a CMP process to planarize the layer of insulating material 176, performing an etching process to define contact openings in the layer of insulating material 176 that expose the semiconductor materials 150A, 150X and thereafter forming the conductive contacts 172, 174 in the contact openings.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming an integrated circuit product on an SOI substrate, said SOI substrate comprising an active semiconductor layer, a bulk semiconductor layer and an insulating material layer positioned between said active semiconductor layer and said bulk semiconductor layer, the method comprising:

forming an isolation structure that extends into said bulk semiconductor layer so as to define first and second active regions on said SOI substrate;

forming a field effect transistor above said first active region, said transistor comprising a source region and a drain region;

forming an opening in said second active region that removes a portion of said active layer and a portion of said insulating material layer in said second active region, wherein said opening exposes an upper surface of said bulk semiconductor layer in said second active region; and performing a common epitaxial growth process so as to form an epi semiconductor material region above each of said source region and said drain region of said transistor and to form a unitary epi semiconductor structure above said second active region, said unitary epi semiconductor structure being formed on and in contact with said exposed upper surface of said bulk semiconductor layer within said opening and on and in contact with an upper surface of said active layer in said second active region.

2. The method of claim 1, wherein said common epitaxial growth process is performed such that an upper surface of said epi semiconductor material regions located above said source region and said drain region and an upper surface of said unitary epi semiconductor structure located above said second active region are all positioned at substantially a same height level relative to an upper surface of said active layer.

3. The method of claim 1, wherein said forming said field effect transistor comprises forming one of a planar field effect transistor device, a FinFET field effect transistor device, an omega gate field effect transistor device or a gate-all-around (GAA) field effect transistor device.

4. The method of claim 1, wherein said unitary epi semiconductor structure comprises at least a portion of one of a horizontal bipolar transistor device, a vertical bipolar transistor device, a junction field effect transistor (JFET) device, a capacitor, a resistor, a diode, a well contact or a well tap.

5. The method of claim 1, wherein said forming said field effect transistor comprises forming a gate electrode that extends across said first active region and at least one other active region in said SOI substrate, wherein said forming said opening in said second active region comprises:
  forming a single etch mask layer that has a first patterned opening that is located at a location that corresponds to a location of said opening and a second patterned opening that is located above a portion of said gate electrode positioned above said isolation structure and between said first active region and said at least one other active region; and
  performing at least one common etching process through said single etch mask layer to form said opening in said second active region and to remove said portion of said gate electrode.

6. The method of claim 1, wherein prior to forming said field effect transistor, the method comprises:
  performing a recess etching process on said isolation structure so as to define an isolation recess above said isolation structure; and
  forming an isolation cap layer in said isolation recess.

7. The method of claim 6, further comprising, after forming said isolation cap layer, forming a layer of gate insulation material on and in contact with said isolation cap layer and on and in contact with an upper surface of said active layer in both said first and second active regions.

8. The method of claim 7, further comprising:
  forming a layer of gate electrode material above said gate insulation layer;
  forming a layer of gate cap material above said layer of gate electrode material; and
  performing at least one etching process so as to pattern said layer of gate cap material and said layer of gate electrode material so as to define at least said gate electrode of a gate structure for said field effect transistor.

9. The method claim 8, wherein, the method further comprises
  forming a single etch mask layer that has a first patterned opening that is located at a location that corresponds to a location of said opening and a second patterned opening that is located above a portion of said gate electrode; and
  performing at least one common etching process through said single etch mask layer to form said opening in said second active region and to remove said portion of said gate electrode.

10. The method claim 1, wherein said unitary epi semiconductor structure comprises an upper portion and a lower portion, wherein said lower portion is positioned within said opening and a lower surface of said lower portion is positioned on and in contact with said upper surface of said bulk semiconductor layer in said second active region, and wherein a lower surface of said upper portion is positioned on and in contact with said upper surface of said active layer in said second active region.

11. The method of claim 1, wherein said unitary epi semiconductor structure comprises an upper portion and a lower portion, said lower portion having a first axial length and a first lateral width and said upper portion having a second axial length and a second lateral width, wherein said second axial length is greater than said first axial length and said second lateral width is greater than said first lateral width.

12. The method of claim 1, wherein said unitary epi semiconductor structure comprises an upper portion and a lower portion and wherein said unitary epi semiconductor structure comprises a recess defined in said upper portion above said lower portion.

13. A method of forming an integrated circuit product on an SOI substrate, said SOI substrate comprising an active semiconductor layer, a bulk semiconductor layer and an insulating material layer positioned between said active semiconductor layer and said bulk semiconductor layer, the product comprising:
  forming an isolation structure that extends into said bulk semiconductor layer so as to define first and second active regions on said SOI substrate;
  performing a recess etching process on said isolation structure so as to define an isolation recess above said isolation structure;
  forming an isolation cap layer in said isolation recess;
  after forming said isolation cap layer, forming a field effect transistor above said first active region, said transistor comprising a source region and a drain region;
  forming an opening in said second active region that removes a portion of said active layer and a portion of said insulating material layer in said second active region, wherein said opening exposes an upper surface of said bulk semiconductor layer in said second active region; and
  performing a common epitaxial growth process so as to form an epi semiconductor material region above each of said source region and said drain region of said transistor and to form a unitary epi semiconductor structure above said second active region, wherein a portion of said unitary epi semiconductor structure is formed on and in contact with said exposed upper surface of said bulk semiconductor layer within said opening and wherein an upper surface of said epi semiconductor material regions located above said source region and said drain region and an upper surface of said unitary epi semiconductor structure are all positioned at substantially a same height level relative to an upper surface of said active layer.

14. The method of claim 13, wherein said unitary epi semiconductor structure comprises an upper portion, wherein a lower surface of said upper portion is formed on and in contact with an upper surface of said active layer in said second active region.

15. The method of claim 13, wherein said unitary epi semiconductor structure comprises an upper portion and a lower portion, wherein said lower portion is positioned within said opening and a lower surface of said lower portion is positioned on and in contact with said upper surface of said bulk semiconductor in said second active region.

16. The method of claim 13, wherein forming said field effect transistor comprises forming a gate electrode that extends across said first active region and at least one other active region in said SOI substrate, wherein forming said opening in said second active region comprises:
  forming a single etch mask layer that has a first patterned opening that is located at a location that corresponds to a location of said opening and a second patterned opening that is located above a portion of said gate electrode positioned above said isolation structure and between said first active region and said at least one other active region; and performing at least one common etching process through said single etch mask layer to form said opening in said second active region and to remove said portion of said gate electrode.

17. The method of claim 13, further comprising, after forming said isolation cap layer, forming a layer of gate insulation material on and in contact with said isolation cap layer and on and in contact with an upper surface of said active layer in both said first and second active regions.

18. The method of claim 17, further comprising:
  forming a layer of gate electrode material above said gate insulation layer;
  forming a layer of gate cap material above said layer of gate electrode material; and
  performing at least one etching process so as to pattern said layer of gate cap material and said layer of gate electrode material so as to define at least said gate electrode of a gate structure for said field effect transistor.

19. The method claim 18, wherein the method further comprises
  forming a single etch mask layer that has a first patterned opening that is located at a location that corresponds to a location of said opening and a second patterned opening that is located above a portion of said gate electrode; and
  performing at least one common etching process through said single etch mask layer to form said opening in said second active region and to remove said portion of said gate electrode.

20. The method claim 13, wherein said unitary epi semiconductor structure comprises an upper portion and a lower portion, said lower portion having a first axial length and a first lateral width and said upper portion having a second axial length and a second lateral width, wherein said second axial length is greater than said first axial length and said second lateral width is greater than said first lateral width.

21. The method of claim 20, wherein the unitary epi semiconductor structure further comprises a recess defined in said upper portion above said lower portion.

22. An integrated circuit product formed above an SOI substrate, the SOI substrate comprising an active semiconductor layer, a bulk semiconductor layer and an insulating material layer positioned between said active semiconductor layer and said bulk semiconductor layer, the product comprising:

an isolation structure that extends into said bulk semiconductor layer so as to define first and second active regions on said SOI substrate;
  a field effect transistor positioned above said first active region, said field effect transistor comprising a source region and a drain region;
  an opening defined in said second active region that extends to an upper surface of said bulk semiconductor layer in said second active region;
  an epi semiconductor material region positioned above each of said source region and said drain region of said transistor; and
  a unitary epi semiconductor structure positioned above said second active region, said unitary epi semiconductor structure having an upper portion and a lower portion, wherein a lower surface of said lower portion is positioned on and in contact with said upper surface of said bulk semiconductor layer within said opening, a lower surface of said upper portion is positioned on and in contact with said active layer in said second active region and an upper surface of said epi semiconductor material regions located above said source region and said drain region and an upper surface of said upper portion of said unitary epi semiconductor structure are all positioned at substantially a same height level relative to an upper surface of said active layer.

23. The product of claim 22, wherein said field effect transistor comprises one of a planar field effect transistor device, a FinFET field effect transistor device, an omega gate field effect transistor device or a gate-all-around (GAA) field effect transistor device.

24. The product of claim 22, further comprising an isolation cap layer positioned in said isolation structure.

25. The product of claim 22, wherein said lower portion has a first axial length and a first lateral width and said upper portion has a second axial length and a second lateral width, wherein said second axial length is greater than said first axial length and said second lateral width is greater than said first lateral width.

26. The product of claim 22, further comprising a recess defined in said upper portion above said lower portion.

* * * * *